(12) United States Patent
Matsubara et al.

(10) Patent No.: US 11,595,014 B2
(45) Date of Patent: Feb. 28, 2023

(54) FILTER CIRCUIT AND FILTER DEVICE

(71) Applicant: Murata Manufacturing Co., Ltd., Kyoto (JP)

(72) Inventors: Hiroshi Matsubara, Kyoto (JP); Masanori Kato, Kyoto (JP); Syunsuke Kido, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 194 days.

(21) Appl. No.: 16/727,597

(22) Filed: Dec. 26, 2019

(65) Prior Publication Data
US 2020/0212866 A1 Jul. 2, 2020

(30) Foreign Application Priority Data
Dec. 28, 2018 (JP) .............................. JP2018-247109

(51) Int. Cl.
*H03H 7/01* (2006.01)
*H03H 9/60* (2006.01)
*H03H 9/05* (2006.01)
*H03H 9/64* (2006.01)
*H03H 1/00* (2006.01)

(52) U.S. Cl.
CPC ........ *H03H 7/0115* (2013.01); *H03H 7/0161* (2013.01); *H03H 7/175* (2013.01); *H03H 9/0576* (2013.01); *H03H 9/605* (2013.01); *H03H 9/6483* (2013.01); *H03H 2001/0085* (2013.01)

(58) Field of Classification Search
CPC .... H03H 7/0115; H03H 7/0161; H03H 7/175; H03H 9/0576; H03H 9/605; H03H 9/6483
See application file for complete search history.

(56) References Cited

U.S. PATENT DOCUMENTS

| | | | |
|---|---|---|---|
| 2013/0147678 A1* | 6/2013 | Taniguchi | H03H 9/706 343/853 |
| 2015/0222246 A1 | 8/2015 | Nosaka | |
| 2016/0218696 A1 | 7/2016 | Nosaka | |
| 2017/0093374 A1* | 3/2017 | Yatsenko | H03H 9/706 |
| 2017/0134005 A1 | 5/2017 | Takeuchi et al. | |

(Continued)

FOREIGN PATENT DOCUMENTS

| | | |
|---|---|---|
| JP | 2016-136686 A | 7/2016 |
| JP | 2018-078542 A | 5/2018 |

(Continued)

*Primary Examiner* — Samuel S Outten
(74) *Attorney, Agent, or Firm* — Pearne & Gordon LLP

(57) ABSTRACT

A filter circuit that secures the steepness from a pass range to an attenuation range while maintaining a wide-band transmission characteristic and a filter device including this filter circuit are formed. A filter circuit includes a first filter and a second filter. The first filter is a filter including an LC circuit in which a first frequency band is a pass band and a frequency band not higher than the first frequency band is an attenuation band. The second filter is a filter that attenuates a second frequency band within the first frequency band by using an attenuation pole produced by a resonance or an antiresonance of an acoustic wave resonator. Further, the first filter is placed closer to an antenna terminal than the second filter.

15 Claims, 33 Drawing Sheets

(56) References Cited

U.S. PATENT DOCUMENTS

| | | |
|---|---|---|
| 2018/0123547 A1 | 5/2018 | Kato et al. |
| 2019/0123771 A1* | 4/2019 | Takeuchi ............... H03H 7/463 |
| 2020/0136588 A1* | 4/2020 | Alicioglu ............. H04B 1/1036 |
| 2020/0169240 A1* | 5/2020 | Cheon .................... H03H 9/542 |

FOREIGN PATENT DOCUMENTS

| | | |
|---|---|---|
| WO | 2014/064987 A1 | 5/2014 |
| WO | 2016/013659 A1 | 1/2016 |

* cited by examiner

FILTER CIRCUIT AND FILTER DEVICE

This application claims priority from Japanese Patent Application No. 2018-247109 filed on Dec. 28, 2018. The content of this application is incorporated herein by reference in its entirety.

BACKGROUND

The present disclosure relates to a filter circuit to be connected to an antenna and a filter device including this filter circuit. Japanese Unexamined Patent Application Publication No. 2016-136686 discloses a band pass filter that achieves both the steepness of a notch filter formed of acoustic wave resonators and a wide-band transmission characteristic of a LC filter by cascade-connecting a low pass filter using acoustic wave resonators and a high pass filter using acoustic wave resonators.

Specifically, an example is described in which, in a cascade connection circuit of an HPF formed of an LC circuit and an LPF formed of an LC circuit, series-connected capacitors of the HPF and shunt-connected capacitors of the LPF are each replaced with an acoustic wave resonator, antiresonances of the series resonators and resonances of the shunt resonators attenuate both GNSS band and 2.4 GHz wireless LAN frequency band, and LC resonance circuits between the resonators attenuate LB band in LTE bands and a distant 5 GHz band.

BRIEF SUMMARY

The band pass filter described in Japanese Unexamined Patent Application Publication No. 2016-136686 is useful to realize a wide-band steep filter multiplexer. For example, it is necessary to use acoustic wave resonators to form an attenuation range within a narrow band while realizing a wide-band filter in a band between about 3 GHz to about 4 GHz.

However, the acoustic wave resonator inherently has nonlinear distortion and has inferior IMD characteristics compared with a LC filter when a large power transmitting signal is input (applied).

In particular, when an attempt is made to design an acoustic wave resonator for use in a communication system that uses a band of about 3 GHz to about 4 GHz, the structure of the acoustic wave resonator changes to the one with higher energy density. For example, in the case with a SAW resonator, changes like narrower IDT pitch and thinner IDT electrode film thickness compared with a prior art frequency band would occur, and the distortion generated in the SAW resonator is expected to increase. Further, in the cases where simultaneous transmission and reception (dual connectivity: DC) with LTE bands, simultaneous operations (co-existence) of 2.4 GHz/5 GHz band wireless LAN, and the like, it is expected that transmitting signals of a plurality of frequency bands would enter a filter circuit, and degradation of receiving sensitivity may occur to the extent that communications standards are not satisfied.

Accordingly, the present disclosure provides a filter circuit that secures the steepness from a pass range to an attenuation range while maintaining a wide-band transmission characteristic and a filter device including this filter circuit.

(A) A filter circuit as an example of the present disclosure is a filter circuit to be connected to an antenna terminal, the filter circuit including: a first filter including an LC circuit in which a first frequency band is a pass band and a frequency band not higher than the first frequency band is an attenuation band; and a second filter that attenuates at least part of one of a second frequency band (n77) and a third frequency band (n79) using an attenuation pole produced by a resonance or an antiresonance of an acoustic wave resonator, the second frequency band and the third frequency band being included in the first frequency band, the third frequency band being higher in frequency than the second frequency band, wherein the first filter is placed closer to the antenna terminal than the second filter.

According to the foregoing configuration, IMD generated at the acoustic wave resonator is suppressed by placing the LC filter on the side closer to the antenna terminal to which a large power signal having a frequency outside the pass band of the first frequency band is applied, and the wide-band transmission characteristic is maintained by the LC filter. In other words, the steepness from the pass range to the attenuation range is secured while maintaining the wide-band transmission characteristic.

(B) A filter device as an example of the present disclosure includes a first filter circuit and a second filter circuit provided between a common port and a first input/output port and between the common port and a second input/output port, respectively, wherein the first filter circuit and the second filter circuit are each the foregoing filter circuit, and the first filter circuit attenuates Band n77 that is the second frequency band, and the second filter circuit attenuates Band n79 that is the third frequency band.

The foregoing configuration enables the filter device to be used as a diplexer for Band n77 and Band n79 of the 3GPP bands.

The present disclosure enables to achieve a filter circuit in which, by placing the filter including an LC circuit on the side closer to the antenna terminal to which a large power signal having a frequency outside the band of the first frequency band is applied, the generation of IMD at the acoustic wave resonator is suppressed, the wide-band transmission characteristic is maintained, and the steepness from the pass range to the attenuation range is secured. Further, the present disclosure enables to achieve a filter device including this filter circuit.

Other features, elements, characteristics and advantages of the present disclosure will become more apparent from the following detailed description of embodiments of the present disclosure with reference to the attached drawings.

DETAILED DESCRIPTION

Figure 1:
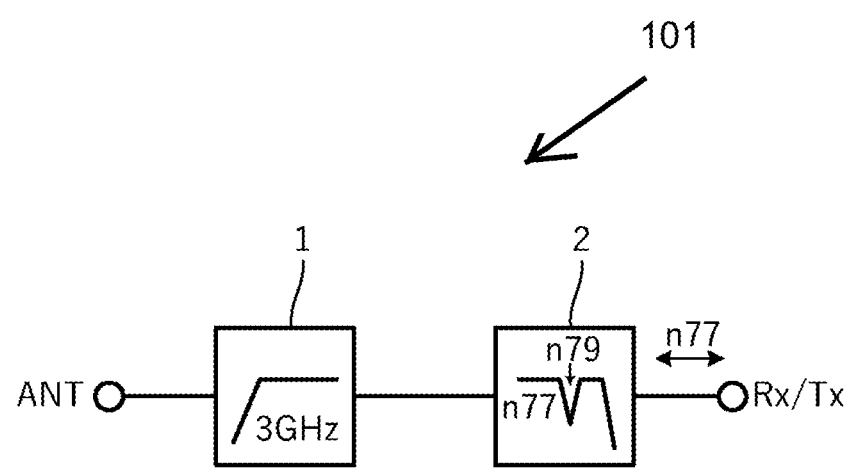
FIG. 1 is a block diagram of a filter circuit according to a first embodiment.

A plurality of embodiments for implementing the present disclosure is described hereinafter with several specific examples while referring to the drawings. Same reference codes designate same parts throughout the drawings. Considering ease of explanation or understanding of key points, separate descriptions of the embodiments are provided for the sake of expedience. However, configurations illustrated in different embodiments may be partially exchanged or combined. In the description of the second embodiment and subsequent embodiments, descriptions regarding matters common to the first embodiment will not be repeated, and only different points will be described. In particular, similar functions and effects produced by a similar configuration will not be described in each embodiment.

First Embodiment

FIG. 1 is a block diagram of a filter circuit 101 according to the first embodiment. This filter circuit 101 includes an antenna terminal ANT to which an antenna is connected, a transmitting/receiving terminal Rx/Tx to which a transmitting/receiving circuit is connected, a first filter 1, and a second filter 2. The first filter 1 is a high pass filter in which a first frequency band is a pass band and a frequency band not higher than the first frequency band is an attenuation band. The second filter 2 is a filter that attenuates a third frequency band within the first frequency band.

The foregoing first frequency band is, for example, a frequency band not lower than about 3 GHz (a frequency band of about 3 GHz and above). The third frequency band is Band n79 of the 3GPP bands. In other words, the second filter 2 allows Band n77 to pass and attenuates Band n79.

The first filter 1 is a filter formed of an LC circuit, and the second filter 2 is a filter that uses an attenuation pole produced by a resonance or an antiresonance of an acoustic wave resonator for attenuation. Further, the first filter 1 is placed closer to the antenna terminal ANT than the second filter 2.

Figure 2:
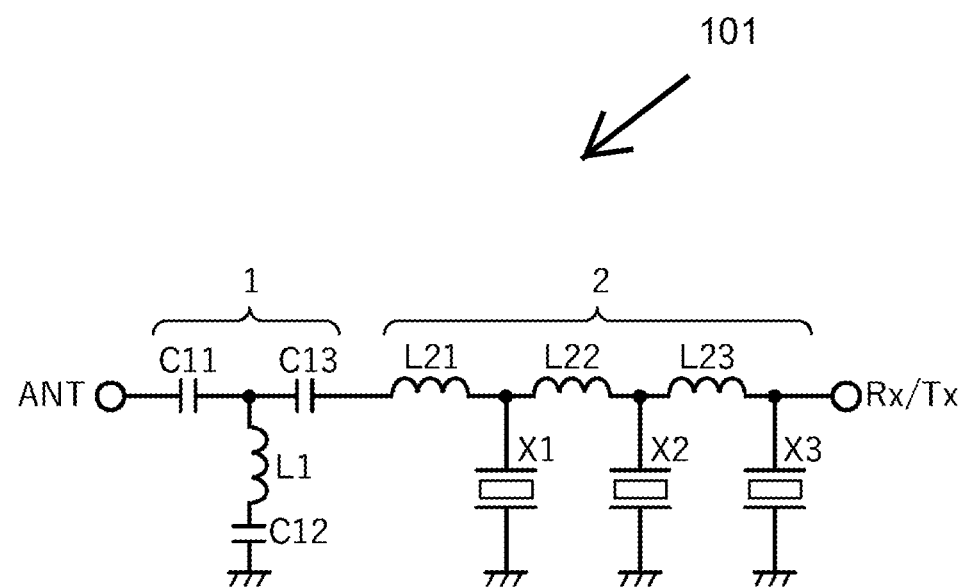
FIG. 2 is a diagram illustrating a circuit configuration of the filter circuit according to the first embodiment.

FIG. 2 is a diagram illustrating the circuit configuration of the filter circuit 101. Circuits of the first filter 1 and the second filter 2 are both illustrated using circuit element symbols.

The first filter 1 is made up of a shunt-connected series circuit of an inductor L1 and a capacitor C12 and series-connected capacitors C11 and C13. The attenuation of the first filter 1 is about −10 dB or lower at a frequency band not higher than the first frequency band.

The second filter 2 is a ladder circuit made up of series-connected inductors L21, L22, and L23 and shunt-connected acoustic wave resonators X1, X2, and X3.

The first filter 1 is a high pass filter with a cutoff frequency of about 3 GHz. The second filter 2 is a low pass filter that produces attenuation poles at frequencies of resonances of the acoustic wave resonators X1, X2, and X3.

Figure 3A:
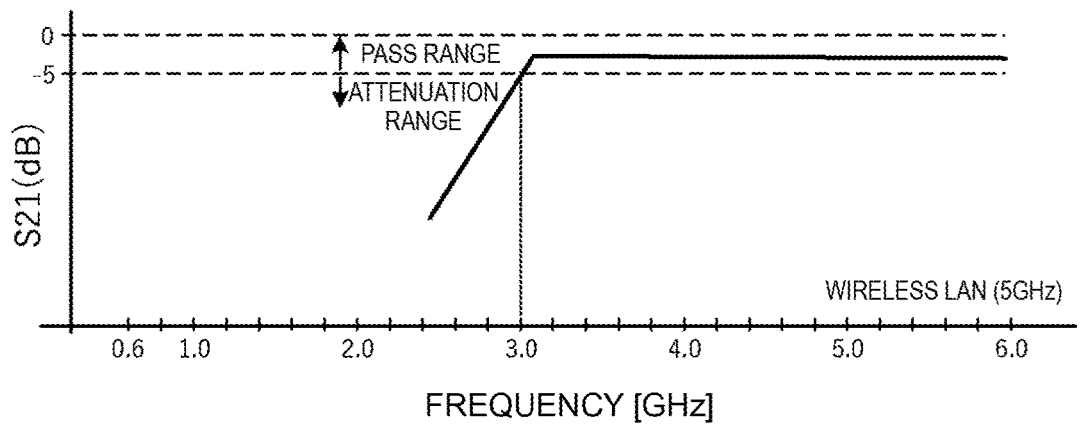
FIG. 3A is a frequency characteristic diagram of insertion loss of a first filter of the filter circuit according to the first embodiment.
Figure 3B:
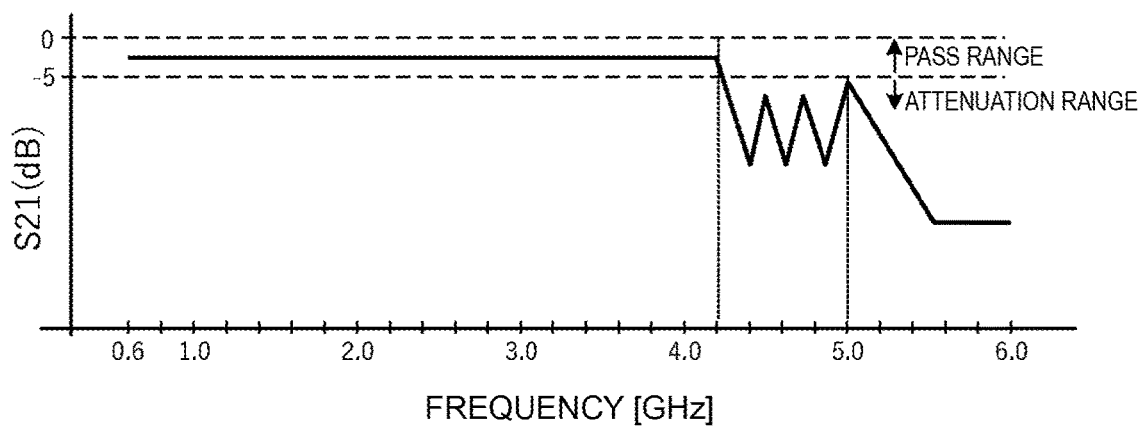
FIG. 3B is a frequency characteristic diagram of insertion loss of a second filter of the filter circuit according to the first embodiment.
Figure 3C:
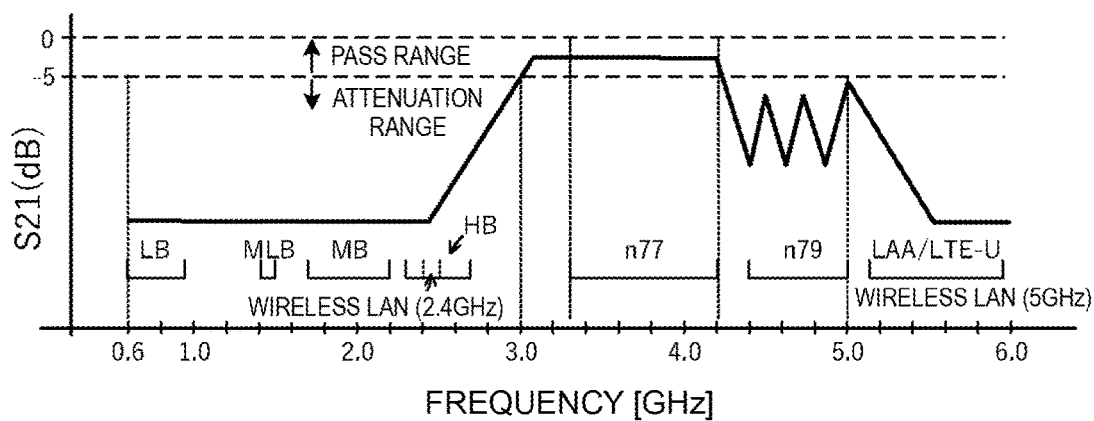
FIG. 3C is a frequency characteristic diagram of insertion loss of the filter circuit according to the first embodiment.

FIG. 3A is a frequency characteristic diagram of insertion loss of the first filter 1. FIG. 3B is a frequency characteristic diagram of insertion loss of the second filter 2. FIG. 3C is a frequency characteristic diagram of insertion loss of the filter circuit 101. In all the drawings, the horizontal axis represents the frequency, and the vertical axis represents S21 (transmission coefficient) of S-parameters. Here, the threshold value between the pass range and the cutoff range is about −5 dB.

The first filter 1 exhibits a high pass characteristic with a cutoff frequency of about 3 GHz. The second filter 2 has a low pass filter characteristic with a cutoff frequency of about 5 GHz and a notch filter characteristic that attenuates a frequency band between about 4.4 GHz and about 5.0 GHz inclusive.

As illustrated in FIG. 3C, the filter circuit 101 has a band pass filter characteristic that allows a frequency band between about 3 GHz and about 5.0 GHz inclusive to pass and a notch filter characteristic that attenuates a frequency band between about 4.4 GHz and about 5.0 GHz inclusive. Accordingly, this filter circuit 101 allows Band n77 of the 3GPP band standards to pass and cuts off Band n79. Further, the attenuation of the first filter 1 is about −10 dB or lower at a frequency band not higher than about 3 GHz, and thus signals of LB band, MLB band, MB band, HB band of LTE standards and 2.4 GHz band wireless LAN are cut off sufficiently. Further, signals of LAA/LTE-U in Industry Science Medical (ISM) and 5.0 GHz band wireless LAN are cut off sufficiently.

According to the present embodiment, the generation of IMD at the acoustic wave resonator of the second filter 2 is suppressed by placing the first filter 1 made up of an LC circuit on the side closer to the antenna terminal to which a large power out-of-band signal is applied, and the wide-band transmission characteristic including the sub-6 GHz band is maintained by the first filter 1. In other words, the steepness from the pass range to the attenuation range is secured while maintaining the wide-band transmission characteristic. Further, one (Band n79 in the present embodiment) of two frequency bands (Band n77 and Band n79) in the pass range can be selectively attenuated.

Further, according to the present embodiment, the filter circuit 101 cuts off the frequency band not higher than about 3 GHz, and this enables the filter circuit 101 to be directly connected to a common port together with a filter circuit that allows communication signals of LTE or 2.4 GHz wireless LAN to pass. A specific configuration thereof will be described in another embodiment.

In particular, when an attempt is made to realize the configuration that has a wide band of about 3 GHz to about 4 GHz and a very narrow frequency spacing of about 200 MHz (fractional bandwidth of about 4.7%) such as Band n77 (about 3.3 GHz to about 4.2 GHz) and Band n79 (about 4.4 GHz to about 5.0 GHz), it is desirable to use an acoustic wave resonator. When an attempt is made to design such an acoustic wave resonator, the structure of the acoustic wave resonator changes to the one with higher energy density. For example, in the case with a SAW resonator, changes like narrower IDT pitch and thinner IDT electrode film thickness compared with a prior art frequency band would occur, and the distortion generated in the SAW resonator is expected to increase. Further, in cases where simultaneous transmission and reception (dual connectivity: DC) with a LTE band, simultaneous operations (co-existence) of 2.4 GHz/5 GHz band wireless LAN, and the like, it is expected that transmitting signals of a plurality of frequency bands would enter a filter circuit, and degradation of receiving sensitivity may occur to the extent that communications standards are not satisfied. According to the present embodiment, IMD generated at the acoustic wave resonator of the second filter 2 is suppressed by placing the first filter 1 made up of an LC circuit on the side closer to the antenna terminal to which a large power signal having a frequency outside the pass band of the first frequency band is applied, and the wide-band transmission characteristic including the sub-6 GHz band is maintained by the first filter 1. In other words, the steepness from the pass range to the attenuation range is secured while maintaining the wide-band transmission characteristic.

Second Embodiment

Figure 4A:
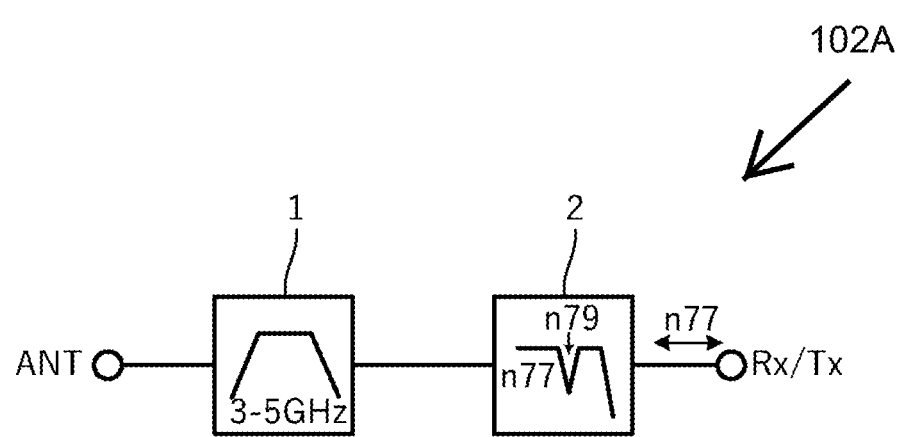
FIG. 4A is a block diagram of a filter circuit according to a second embodiment.
Figure 4B:
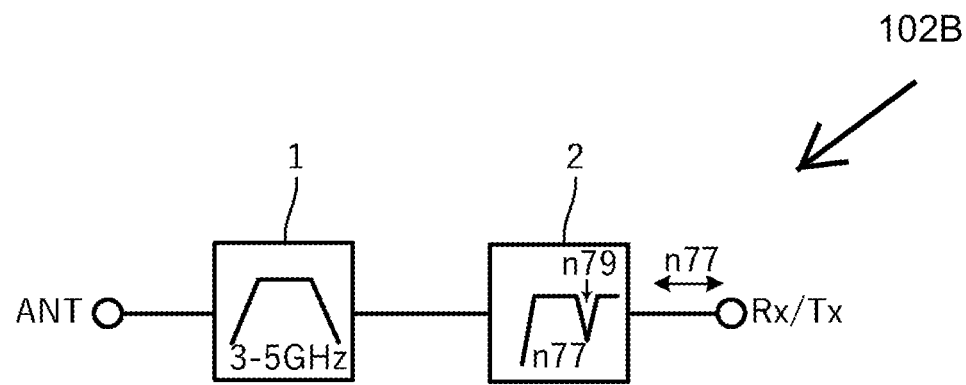
FIG. 4B is a block diagram of a filter circuit according to the second embodiment.

FIG. 4A and FIG. 4B are block diagrams of filter circuits 102A and 102B according to the second embodiment, respectively. The filter circuits 102A and 102B, each includes an antenna terminal ANT to which an antenna is connected, a transmitting/receiving terminal Rx/Tx to which a transmitting/receiving circuit is connected, a first filter 1, and a second filter 2. The first filter 1 is a band pass filter in which a first frequency band is a pass band and a frequency band other than the first frequency band is an attenuation band. The second filter 2 is a filter that attenuates a third frequency band within the first frequency band.

The foregoing first frequency band is, for example, a frequency band not lower than about 3 GHz (a frequency band of about 3 GHz and above). The third frequency band is Band n79 of the 3GPP bands. In other words, the second filter 2 allows Band n77 to pass and attenuates Band n79.

The second filter 2 of the filter circuit 102A has a low pass filter characteristic and a notch filter characteristic, and the second filter 2 of the filter circuit 102B has a high pass filter characteristic and a notch filter characteristic.

Figure 5A:
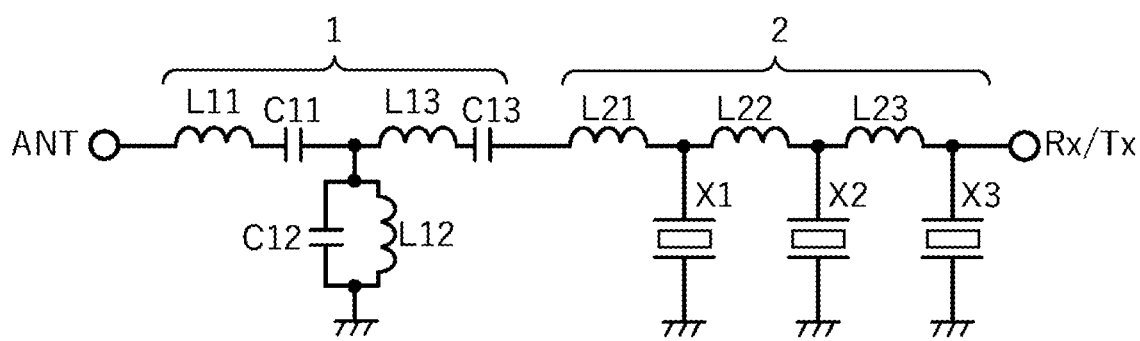
FIG. 5A is a diagram illustrating a circuit configuration of the filter circuit of FIG. 4A.
Figure 5B:
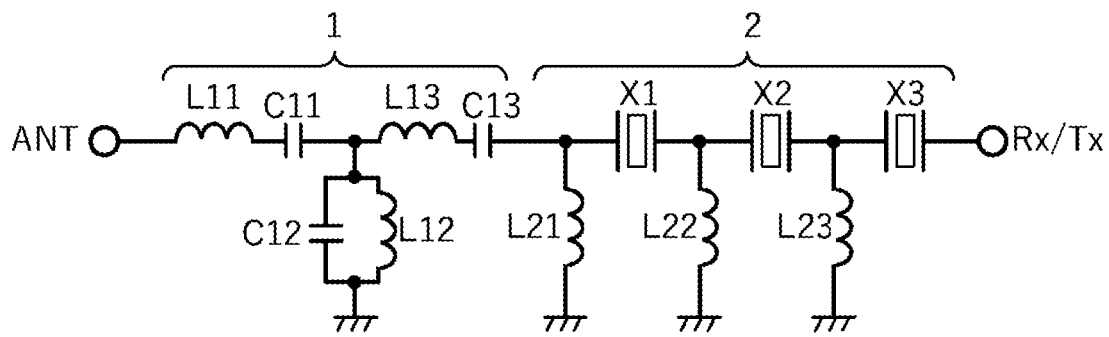
FIG. 5B is a diagram illustrating a circuit configuration of the filter circuit of FIG. 4B.

FIG. 5A is a diagram illustrating the circuit configuration of the filter circuit 102A, and FIG. 5B is a diagram illustrating the circuit configuration of the filter circuit 102B. Circuits of the first filter 1 and the second filter 2 are both illustrated using circuit element symbols.

The first filter 1 is made up of a shunt-connected parallel circuit of an inductor L12 and a capacitor C12 and series-connected inductors L11 and L13 and capacitors C11 and C13.

In FIG. 5A, the second filter 2 is a ladder circuit made up of series-connected inductors L21, L22, and L23 and shunt-connected acoustic wave resonators X1, X2, and X3. The second filter 2 produces attenuation poles at frequencies of resonances of the acoustic wave resonators X1, X2, and X3.

In FIG. 5B, the second filter 2 is a ladder circuit made up of series-connected acoustic wave resonators X1, X2, and X3 and shunt-connected inductors L21, L22, and L23. The second filter 2 produces attenuation poles at frequencies of antiresonances of the acoustic wave resonators X1, X2, and X3.

Figure 6A:
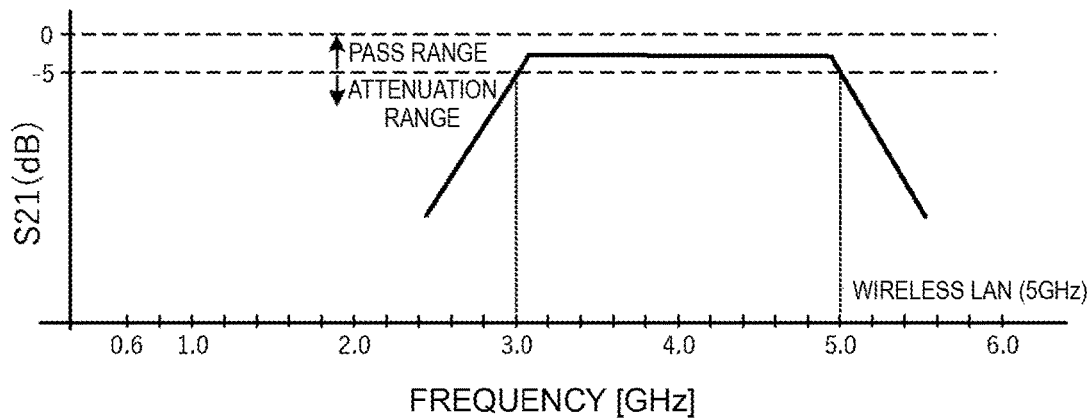
FIG. 6A is a frequency characteristic diagram of insertion loss of a first filter of the filter circuit of FIG. 4A.
Figure 6B:
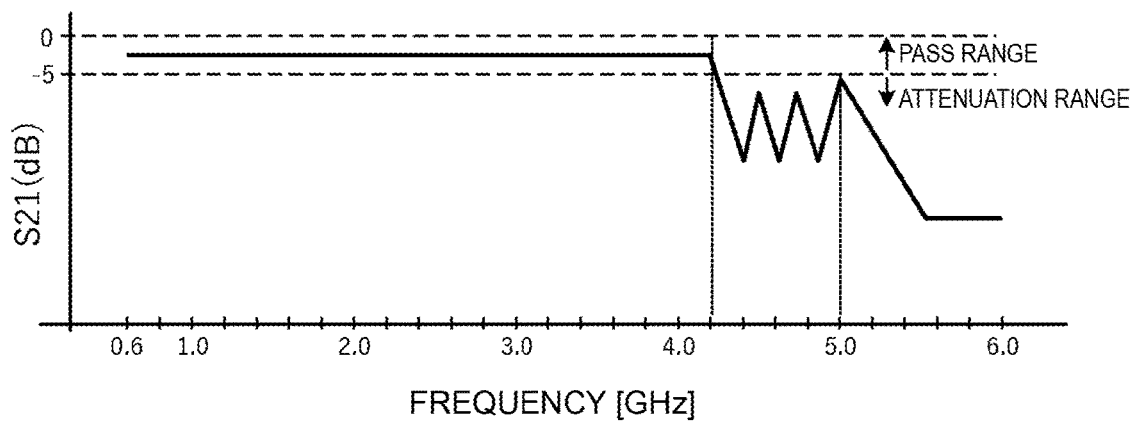
FIG. 6B is a frequency characteristic diagram of insertion loss of a second filter of the filter circuit of FIG. 4A.
Figure 6C:
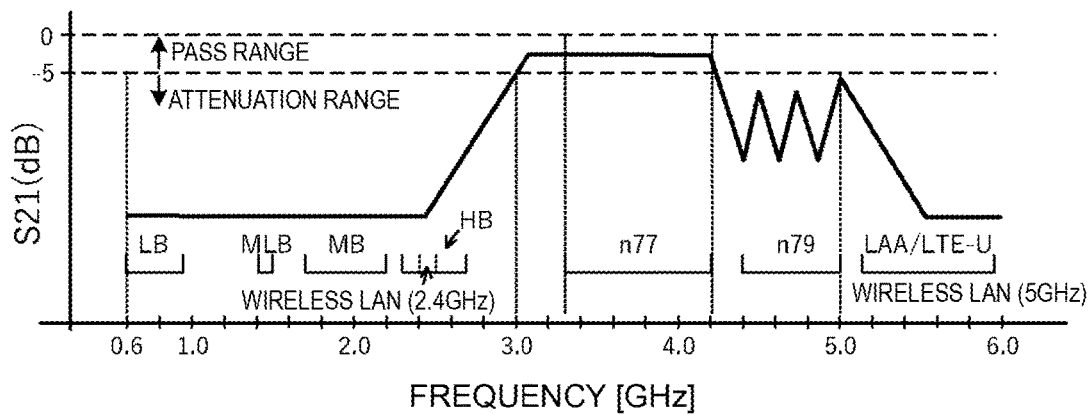
FIG. 6C is a frequency characteristic diagram of insertion loss of the filter circuit of FIG. 4A.

FIG. 6A is a frequency characteristic diagram of insertion loss of the first filter 1 of the filter circuit 102A, and FIG. 6B is a frequency characteristic diagram of insertion loss of the second filter 2 of the filter circuit 102A. Further, FIG. 6C is a frequency characteristic diagram of insertion loss of the filter circuit 102A. In all the diagrams, the threshold value between the pass range and the cutoff range is about −5 dB.

In this way, the first filter 1 of the filter circuit 102A exhibits a band pass characteristic in which a frequency band between a cutoff frequency of about 3 GHz and about 5 GHz inclusive is a pass range and the other is a cutoff range. The second filter 2 has a low pass filter characteristic with a cutoff frequency of about 5 GHz and a notch filter characteristic that attenuates a frequency band between about 4.4 GHz and about 5.0 GHz inclusive.

Figure 7A:
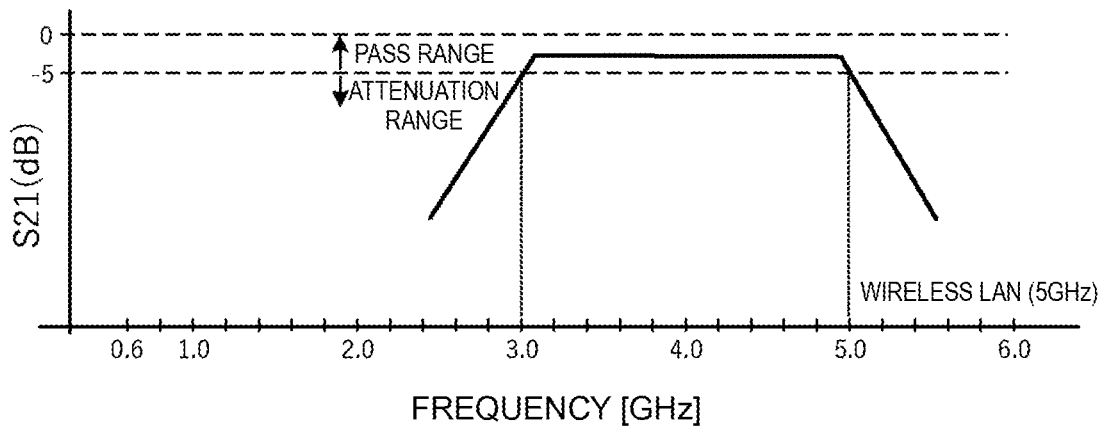
FIG. 7A is a frequency characteristic diagram of insertion loss of a first filter of the filter circuit of FIG. 4B.
Figure 7B:
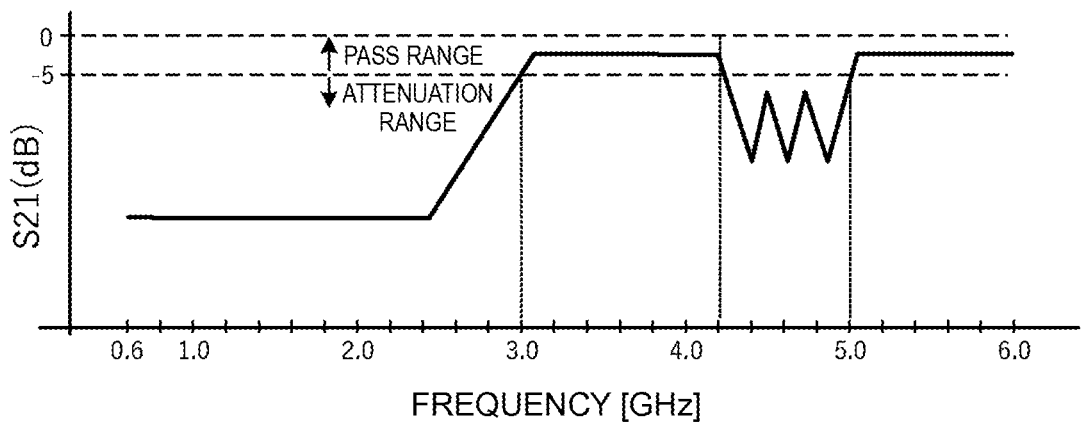
FIG. 7B is a frequency characteristic diagram of insertion loss of a second filter of the filter circuit of FIG. 4B.
Figure 7C:
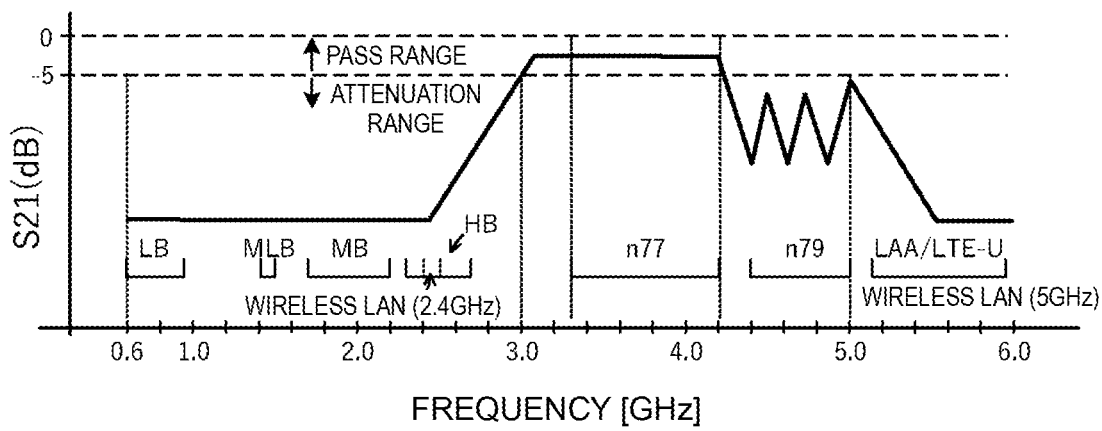
FIG. 7C is a frequency characteristic diagram of insertion loss of the filter circuit of FIG. 4B.

FIG. 7A is a frequency characteristic diagram of insertion loss of the first filter 1 of the filter circuit 102B, and FIG. 7B is a frequency characteristic diagram of insertion loss of the second filter 2 of the filter circuit 102B. Further, FIG. 7C is a frequency characteristic diagram of insertion loss of the filter circuit 102B. In all the diagrams, the threshold value between the pass range and the cutoff range is about −5 dB.

In this way, the first filter 1 of the filter circuit 102B exhibits a band pass characteristic in which a frequency band between a cutoff frequency of about 3 GHz and about 5 GHz inclusive is a pass range and the other is a cutoff range. The second filter 2 has a high pass filter characteristic with a cutoff frequency of about 3 GHz and a notch filter characteristic that attenuates a frequency band between about 4.4 GHz and about 5.0 GHz inclusive.

As illustrated in FIG. 6C and FIG. 7C, the filter circuits 102A and 102B, each has a band pass filter characteristic that allows a frequency band between about 3 GHz and about 5.0 GHz inclusive to pass and a notch filter characteristic that attenuates a frequency band between about 4.4 GHz and about 5.0 GHz inclusive. These filter circuits 102A and 102B have the same characteristics as that of the filter circuit 101 illustrated in the first embodiment.

The characteristics illustrated in FIG. 6C and FIG. 7C obtained by the configurations illustrated in FIG. 5A and FIG. 5B are substantially equal. However, in the second filter 2 formed of the ladder circuit made up of the shunt-connected acoustic wave resonators X1, X2, and X3 and the series-connected inductors L21, L22, and L23 illustrated in FIG. 5A, the insertion loss in a frequency band adjacent to the attenuation range (notch range) is greater whereas the insertion loss in a lower frequency side of Band n77, which is separated from the attenuation range (notch range), is smaller, and the attenuation in the 5 GHz band is greater.

Third Embodiment

Figure 8:
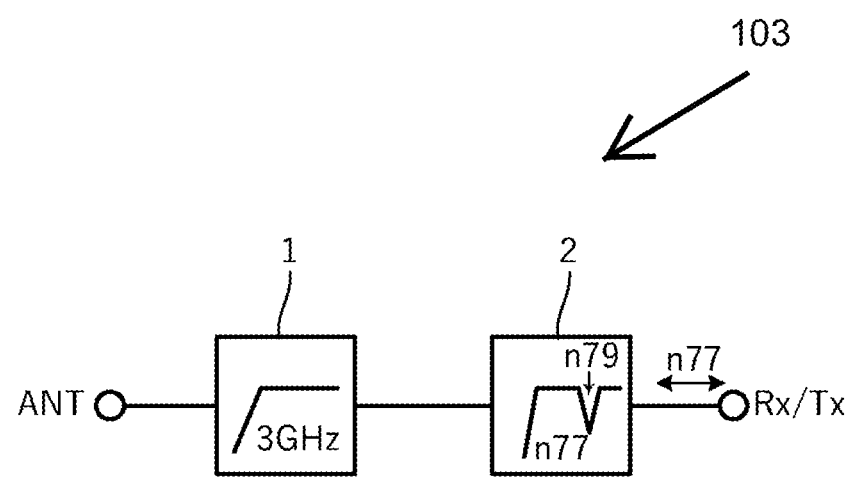
FIG. 8 is a block diagram of a filter circuit according to a third embodiment.

FIG. 8 is a block diagram of a filter circuit 103 according to the third embodiment. This filter circuit 103 includes an antenna terminal ANT to which an antenna is connected, a transmitting/receiving terminal Rx/Tx to which a transmitting/receiving circuit is connected, a first filter 1, and a second filter 2. The first filter 1 is a high pass filter in which a first frequency band is a pass band and a frequency band not higher than the first frequency band is an attenuation band. The second filter 2 is a filter that attenuates a third frequency band within the first frequency band.

The foregoing first frequency band is, for example, a frequency band not lower than about 3 GHz (a frequency band of about 3 GHz and above). The third frequency band is Band n79 of the 3GPP bands. In other words, the second filter 2 allows Band n77 to pass and attenuates Band n79.

Figure 9:
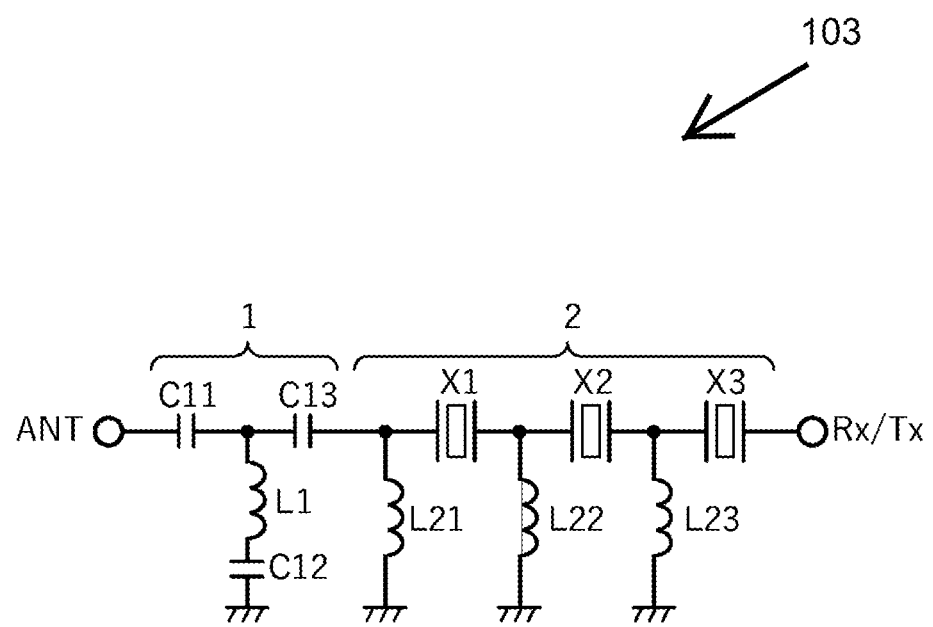
FIG. 9 is a diagram illustrating a circuit configuration of the filter circuit according to the third embodiment.

FIG. 9 is a diagram illustrating the circuit configuration of the filter circuit 103. The first filter 1 is made up of a shunt-connected series circuit of an inductor L1 and a capacitor C12 and series-connected capacitors C11 and C13.

The second filter 2 is a ladder circuit made up of series-connected acoustic wave resonators X1, X2, and X3 and shunt-connected inductors L21, L22, and L23.

The first filter 1 is a high pass filter with a cutoff frequency of about 3 GHz. The second filter 2 produces attenuation poles at frequencies of antiresonances of the acoustic wave resonators X1, X2, and X3.

Figure 10A:
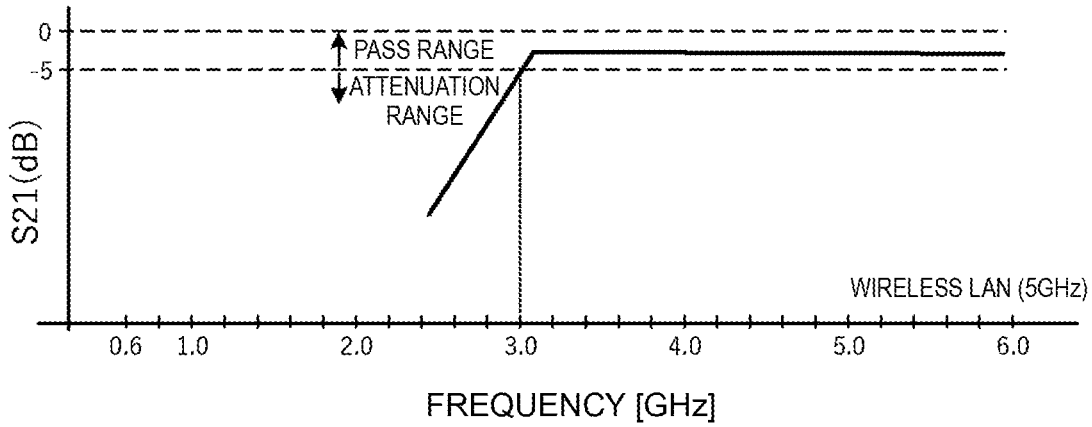
FIG. 10A is a frequency characteristic diagram of insertion loss of a first filter of the filter circuit according to the third embodiment.
Figure 10B:
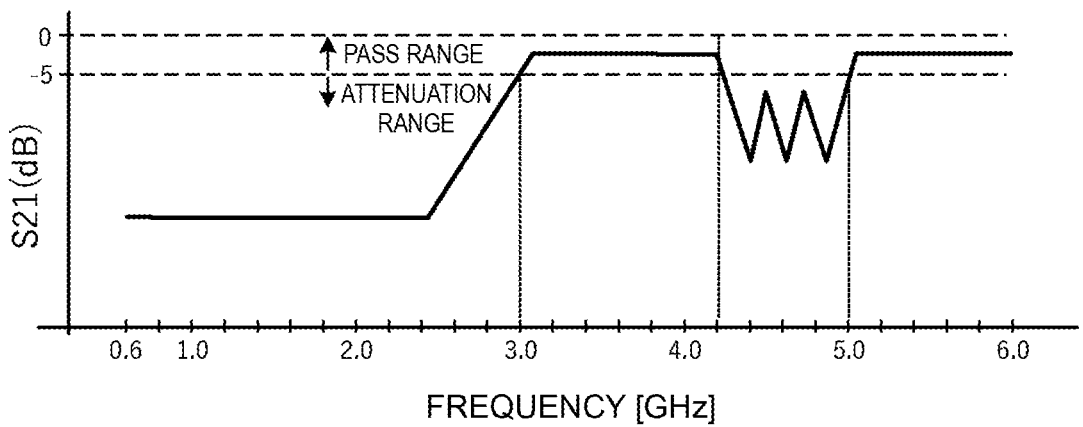
FIG. 10B is a frequency characteristic diagram of insertion loss of a second filter of the filter circuit according to the third embodiment.
Figure 10C:
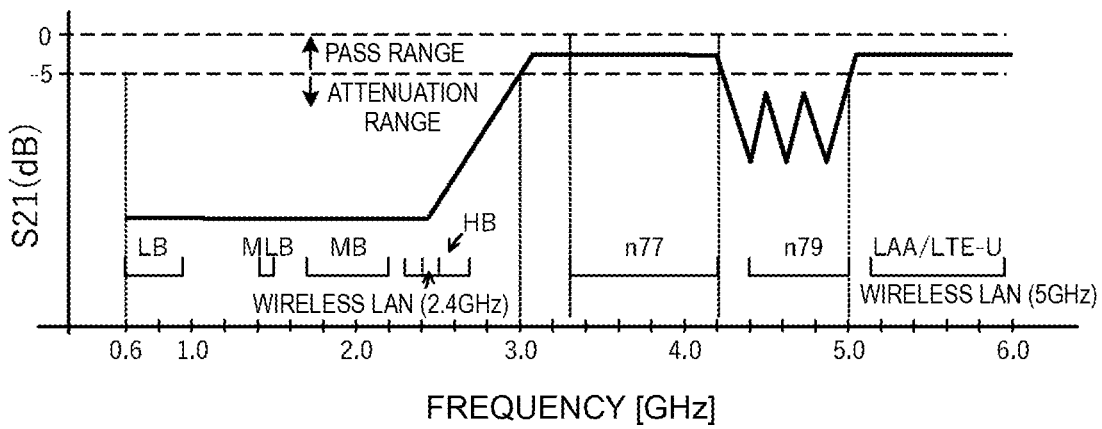
FIG. 10C is a frequency characteristic diagram of insertion loss of the filter circuit according to the third embodiment.

FIG. 10A is a frequency characteristic diagram of insertion loss of the first filter 1 of the filter circuit 103, and FIG. 10B is a frequency characteristic diagram of insertion loss of the second filter 2 of the filter circuit 103. Further, FIG. 10C is a frequency characteristic diagram of insertion loss of the filter circuit 103. In all the diagrams, the threshold value between the pass range and the cutoff range is about −5 dB.

The first filter 1 exhibits a high pass characteristic with a cutoff frequency of about 3 GHz. The second filter 2 has a high pass filter characteristic with a cutoff frequency of about 5 GHz and a notch filter characteristic that attenuates a frequency band between about 4.4 GHz and about 5.0 GHz inclusive.

As illustrated in FIG. 10C, the filter circuit 103 has a high pass filter characteristic that allows the frequencies not lower than about 3 GHz to pass and a notch filter characteristic that attenuates a frequency band between about 4.4 GHz and about 5.0 GHz inclusive. Accordingly, this filter circuit 103 allows Band n77 of the 3GPP band standards to pass and cuts off Band n79. Further, the filter circuit 103 cuts off signals of LB band, MLB band, MB band, HB band of LTE standards and 2.4 GHz band wireless LAN.

Fourth Embodiment

Figure 11:
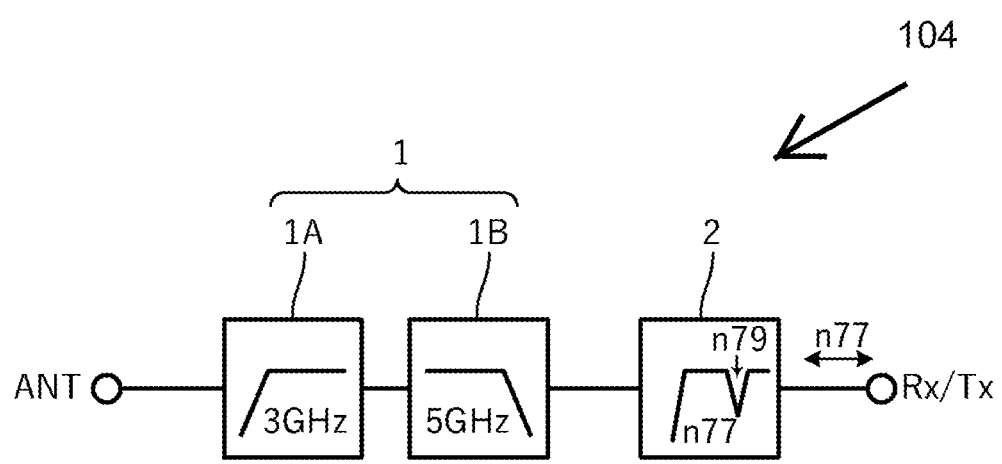
FIG. 11 is a block diagram of a filter circuit according to a fourth embodiment.

FIG. 11 is a block diagram of a filter circuit 104 according to the fourth embodiment. This filter circuit 104 includes an antenna terminal ANT to which an antenna is connected, a transmitting/receiving terminal Rx/Tx to which a transmitting/receiving circuit is connected, a first filter 1, and a second filter 2. The first filter 1 is made up of a high pass filter 1A with a cutoff frequency of about 3 GHz and a low pass filter 1B with a cutoff frequency of about 5 GHz. The second filter 2 is a filter that attenuates a third frequency band within the first frequency band.

Figure 12:
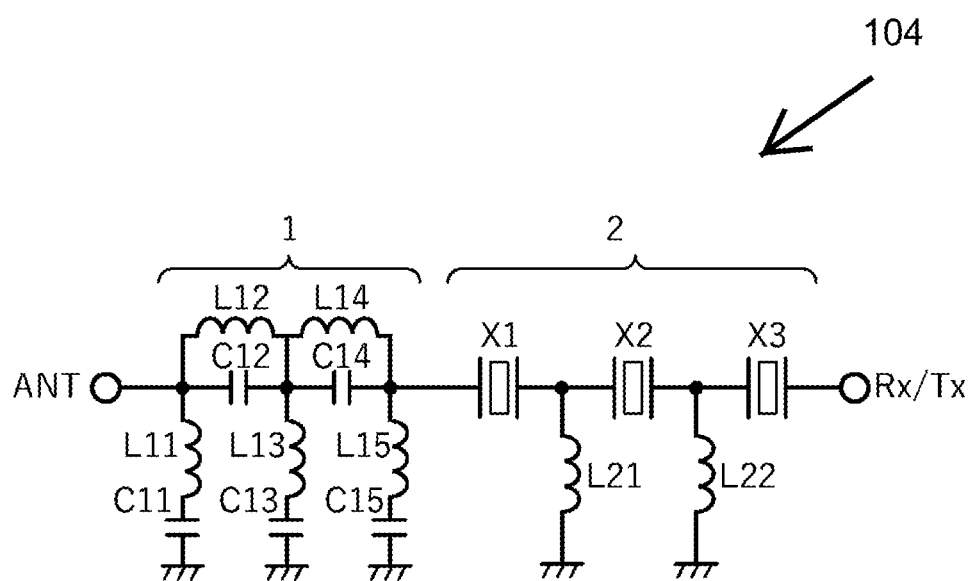
FIG. 12 is a diagram illustrating a circuit configuration of the filter circuit according to the fourth embodiment.

FIG. 12 is a diagram illustrating the circuit configuration of the filter circuit 104. The first filter 1 is made up of a shunt-connected LC series circuit of an inductor L11 and a capacitor C11, a shunt-connected LC series circuit of an inductor L13 and a capacitor C13, a shunt-connected LC series circuit of an inductor L15 and a capacitor C15, a LC parallel circuit of an inductor L12 and a capacitor C12, and a LC parallel circuit of an inductor L14 and a capacitor C14. The LC parallel circuit of the inductor L12 and the capacitor C12 and the LC parallel circuit of the inductor L14 and the capacitor C14 are connected in series.

In the first filter 1 of FIG. 12, the shunt-connected inductors and the series-connected capacitors make up the foregoing high pass filter 1A, and the series-connected inductors and the shunt-connected capacitors make up the foregoing low pass filter 1B.

The second filter 2 is made up of series-connected acoustic wave resonators X1, X2, and X3 and shunt-connected inductors L21 and L22 and produces attenuation poles at frequencies of antiresonances of the acoustic wave resonators X1, X2, and X3.

Figure 13:
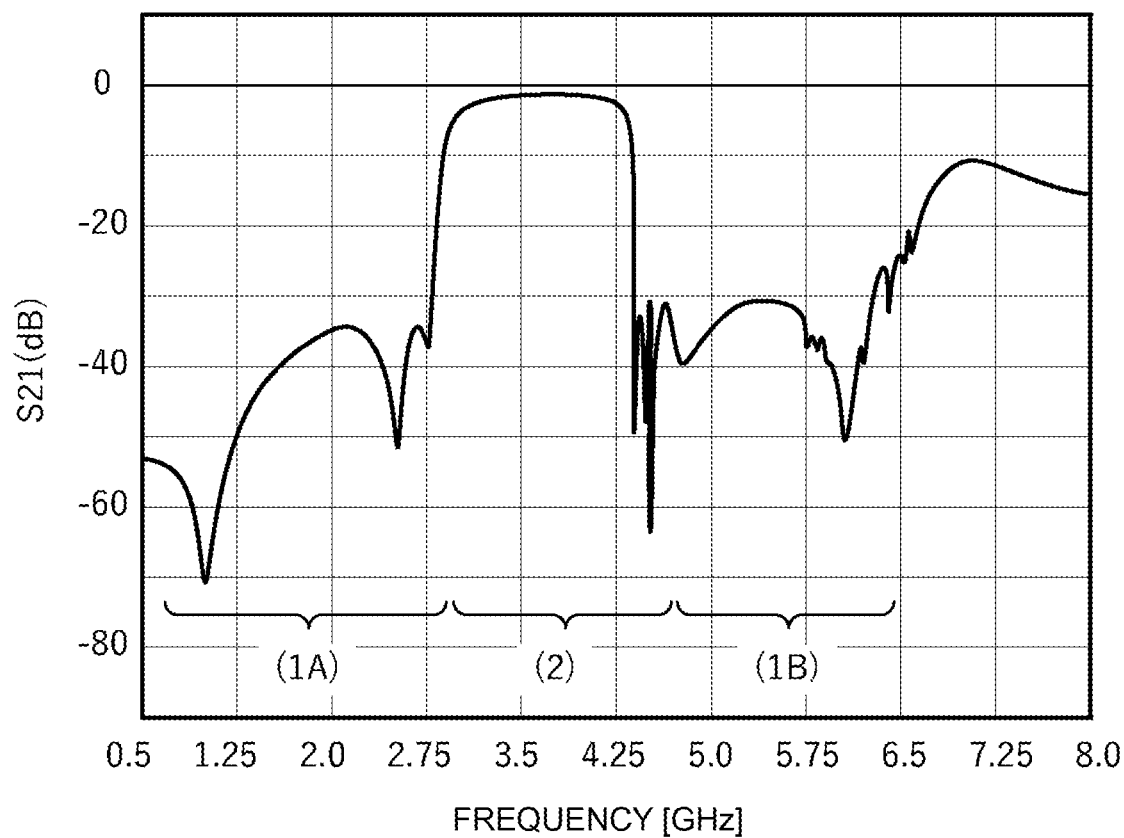
FIG. 13 is a frequency characteristic diagram of insertion loss of the filter circuit according to the fourth embodiment.

FIG. 13 is a frequency characteristic diagram of insertion loss of the filter circuit 104. Here, the frequency band denoted by (1A) is a frequency band of an attenuation range produced by the foregoing LC series circuits, and the frequency band denoted by (1B) is a frequency band of an attenuation range produced by the foregoing LC parallel circuits. Further, the frequency band denoted by (2) is a frequency band where the characteristics of the second filter 2 appear. In other words, a frequency band not higher than about 3 GHz is cut off, and a frequency band between about 4.4 GHz and about 5.0 GHz is cut off.

Fifth Embodiment

Figure 14:
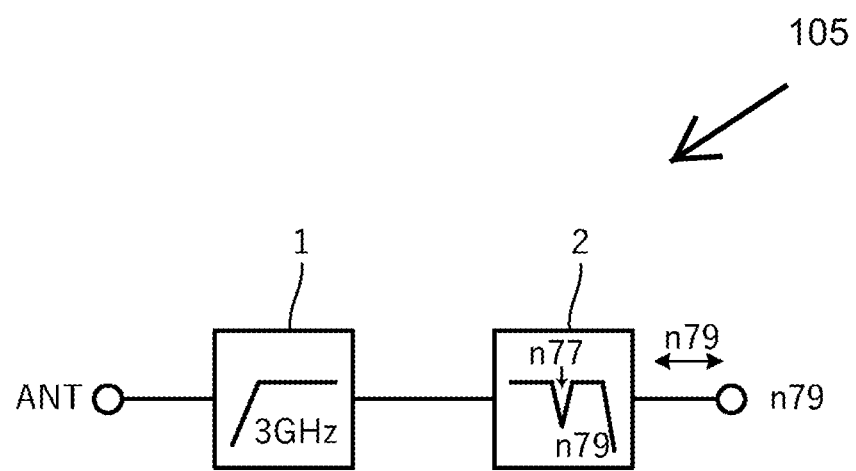
FIG. 14 is a block diagram of a filter circuit according to a fifth embodiment.

FIG. 14 is a block diagram of a filter circuit 105 according to the fifth embodiment. This filter circuit 105 includes an antenna terminal ANT to which an antenna is connected, a transmitting/receiving terminal Rx/Tx to which a transmitting/receiving circuit is connected, a first filter 1, and a second filter 2. The first filter 1 is a high pass filter with a cutoff frequency of about 3 GHz. The second filter 2 is a filter that attenuates Band n77 of the 3GPP band standards.

Figure 15:
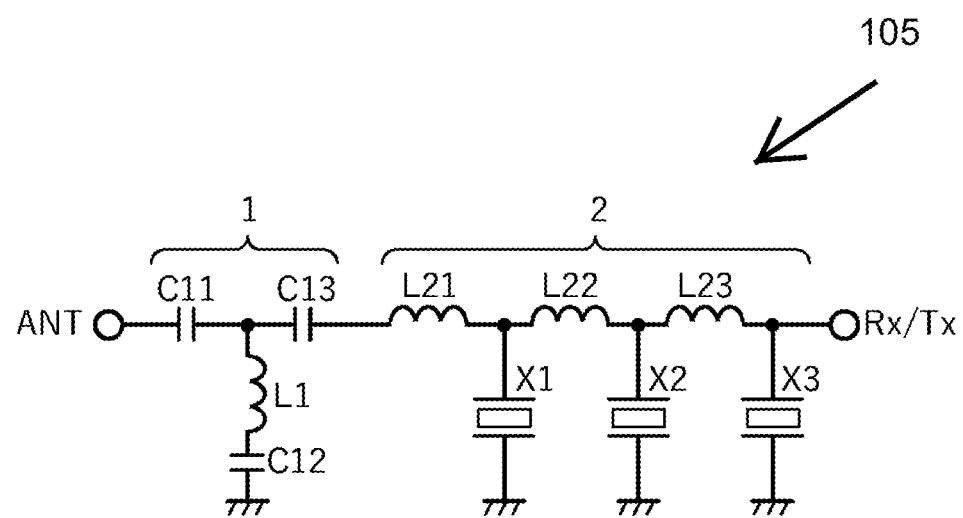
FIG. 15 is a diagram illustrating a circuit configuration of the filter circuit according to the fifth embodiment.

FIG. 15 is a diagram illustrating the circuit configuration of the filter circuit 105. The first filter 1 is made up of a shunt-connected series circuit of an inductor L1 and a capacitor C12 and series-connected capacitors C11 and C13.

The second filter 2 is a ladder circuit made up of series-connected inductors L21, L22, and L23 and shunt-connected acoustic wave resonators X1, X2, and X3.

The first filter 1 is a high pass filter with a cutoff frequency of about 3 GHz. The second filter 2 produces attenuation poles at frequencies of resonances of the acoustic wave resonators X1, X2, and X3.

Figure 16A:
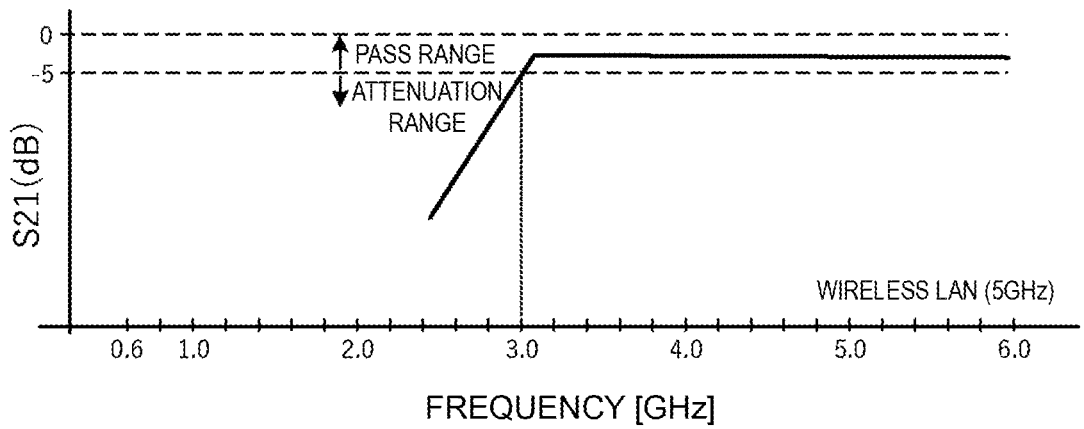
FIG. 16A is a frequency characteristic diagram of insertion loss of a first filter of the filter circuit according to the fifth embodiment.
Figure 16B:
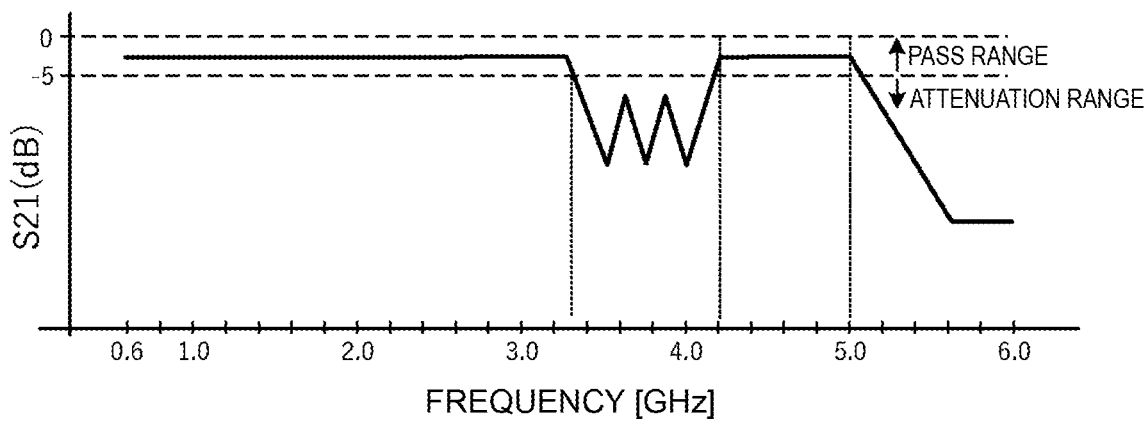
FIG. 16B is a frequency characteristic diagram of insertion loss of a second filter of the filter circuit according to the fifth embodiment.
Figure 16C:
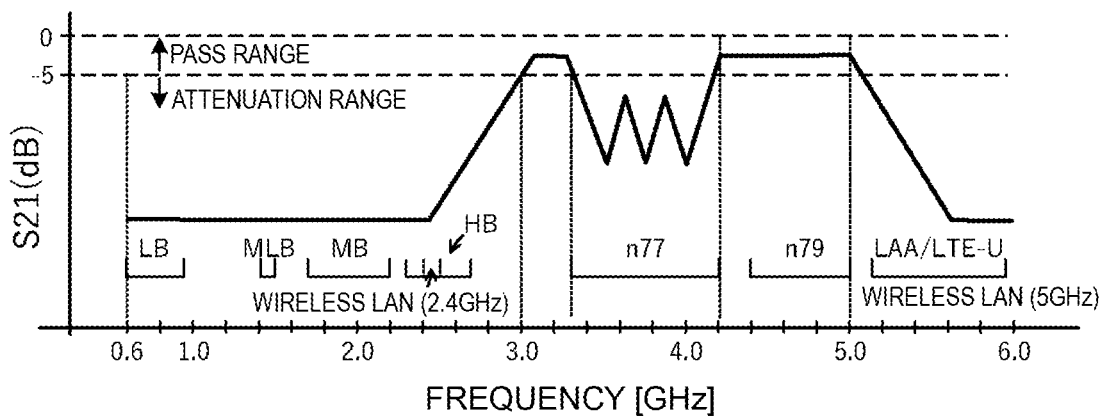
FIG. 16C is a frequency characteristic diagram of insertion loss of the filter circuit according to the fifth embodiment.

FIG. 16A is a frequency characteristic diagram of insertion loss of the first filter 1, and FIG. 16B is a frequency characteristic diagram of insertion loss of the second filter 2. Further, FIG. 16C is a frequency characteristic diagram of insertion loss of the filter circuit 105.

The first filter 1 exhibits a high pass characteristic with a cutoff frequency of about 3 GHz. The second filter 2 has a low pass filter characteristic with a cutoff frequency of about 5 GHz and a notch filter characteristic that attenuates a frequency band between about 3.3 GHz and about 4.2 GHz inclusive. Accordingly, this filter circuit 105 allows Band n79 of the 3GPP band standards to pass and cuts off Band n77. Further, the filter circuit 105 cuts off signals of LB band, MLB band, MB band, HB band of LTE standards and 2.4 GHz band wireless LAN. Further, signals of LAA/LTE-U in Industry Science Medical (ISM) and 5.0 GHz band wireless LAN are cut off.

Sixth Embodiment

Figure 17A:
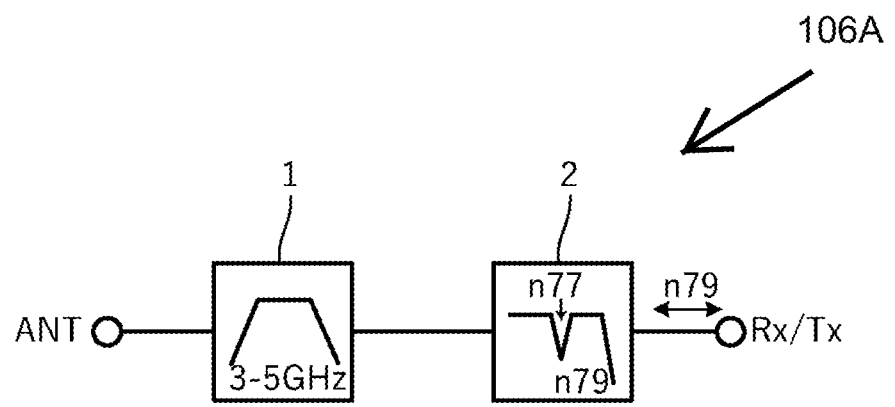
FIG. 17A is a block diagram of a filter circuit according to a sixth embodiment.
Figure 17B:
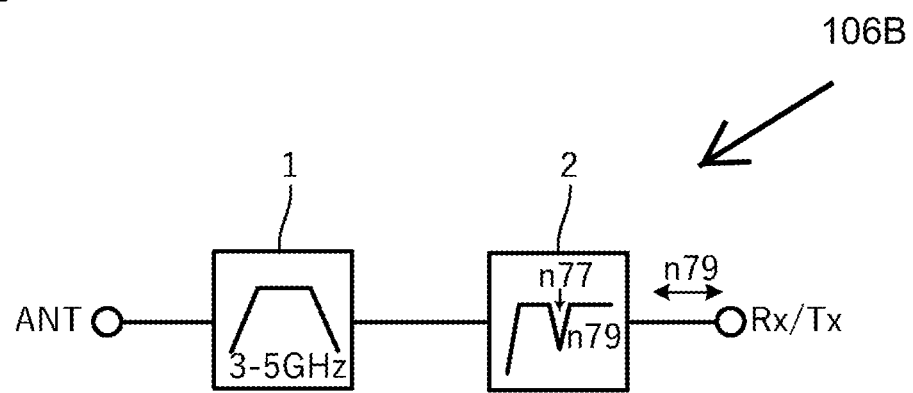
FIG. 17B is a block diagram of a filter circuit according to the sixth embodiment.

FIG. 17A and FIG. 17B are block diagrams of filter circuits 106A and 106B according to the sixth embodiment, respectively. The filter circuits 106A and 106B, each includes an antenna terminal ANT to which an antenna is connected, a transmitting/receiving terminal Rx/Tx to which a transmitting/receiving circuit is connected, a first filter 1, and a second filter 2. The first filter 1 is a band pass filter in which a frequency band between about 3 GHz and about 5 GHz inclusive, which is a first frequency band, is a pass band and a frequency band other than the first frequency band is an attenuation band. The second filter 2 allows Band n79 to pass and cuts off Band n77.

Figure 18A:
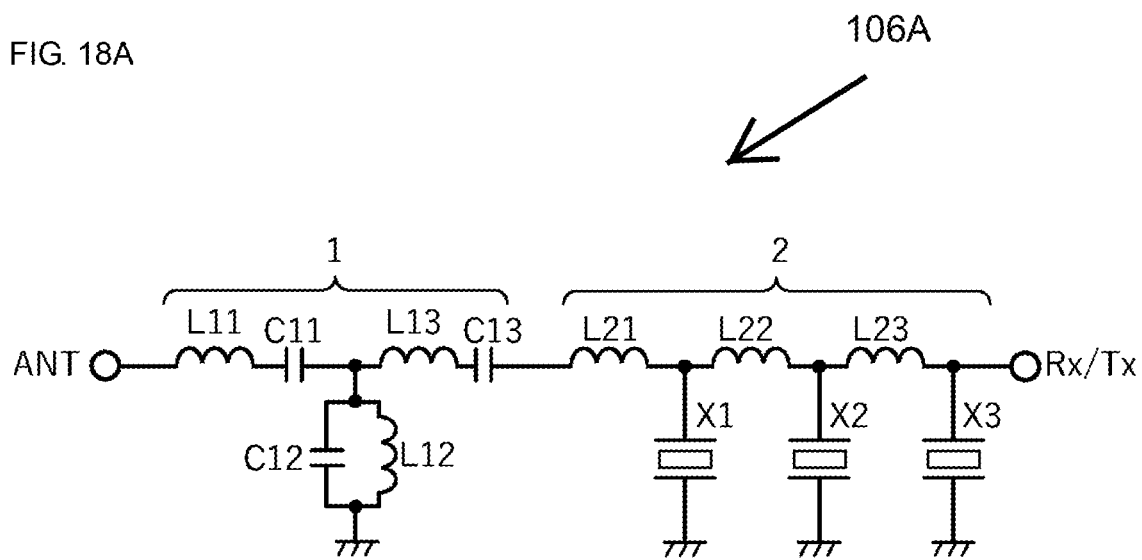
FIG. 18A is a diagram illustrating a circuit configuration of the filter circuit of FIG. 17A.
Figure 18B:
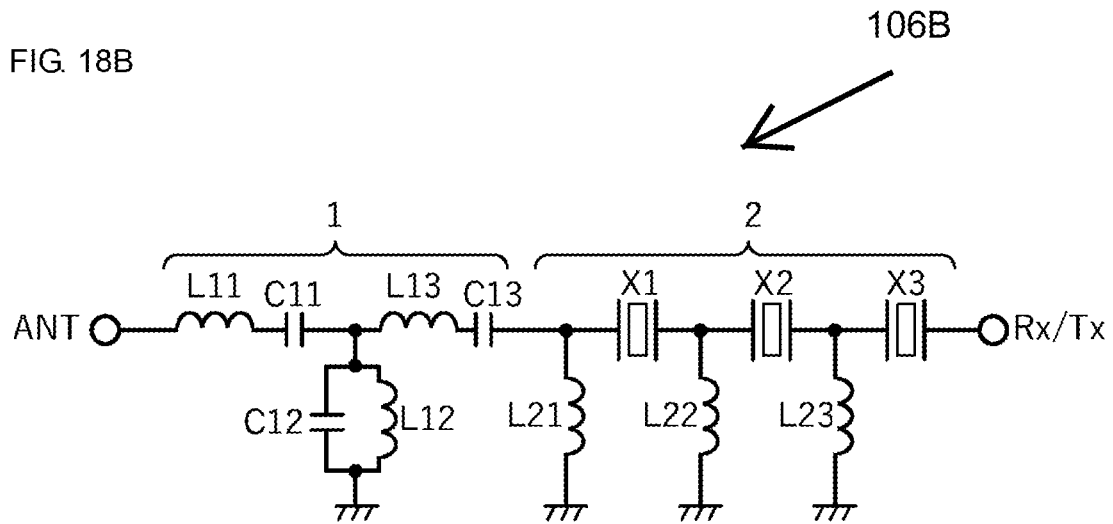
FIG. 18B is a diagram illustrating a circuit configuration of the filter circuit of FIG. 17B.

FIG. 18A is a diagram illustrating the circuit configuration of the filter circuit 106A, and FIG. 18B is a diagram illustrating the circuit configuration of the filter circuit 106B.

The first filter 1 is made up of a shunt-connected parallel circuit of an inductor L12 and a capacitor C12 and series-connected inductors L11 and L13 and capacitors C11 and C13.

In FIG. 18A, the second filter 2 is a ladder circuit made up of series-connected inductors L21, L22, and L23 and shunt-connected acoustic wave resonators X1, X2, and X3. The second filter 2 produces attenuation poles at frequencies of resonances of the acoustic wave resonators X1, X2, and X3.

In FIG. 18B, the second filter 2 is a ladder circuit made up of series-connected acoustic wave resonators X1, X2, and X3 and shunt-connected inductors L21, L22, and L23. The second filter 2 produces attenuation poles at frequencies of antiresonances of the acoustic wave resonators X1, X2, and X3.

Figure 19A:
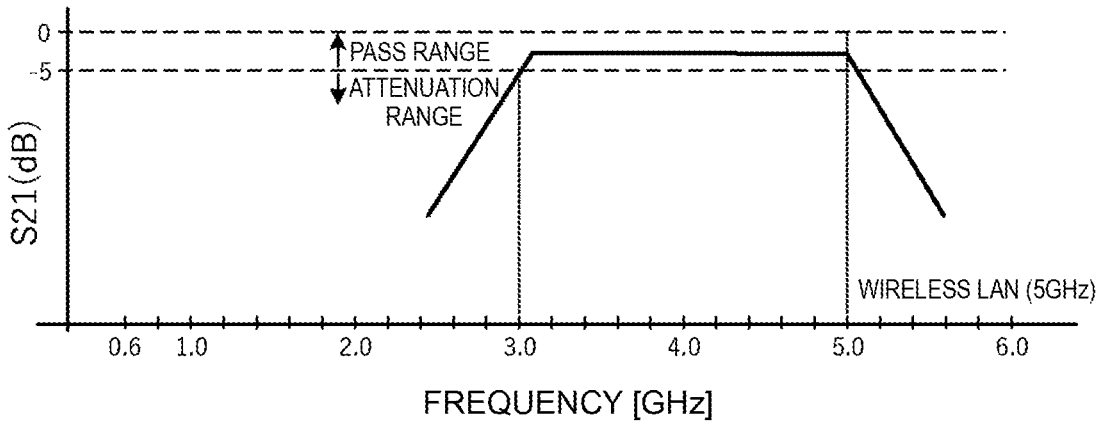
FIG. 19A is a frequency characteristic diagram of insertion loss of a first filter of the filter circuit of FIG. 17A.
Figure 19B:
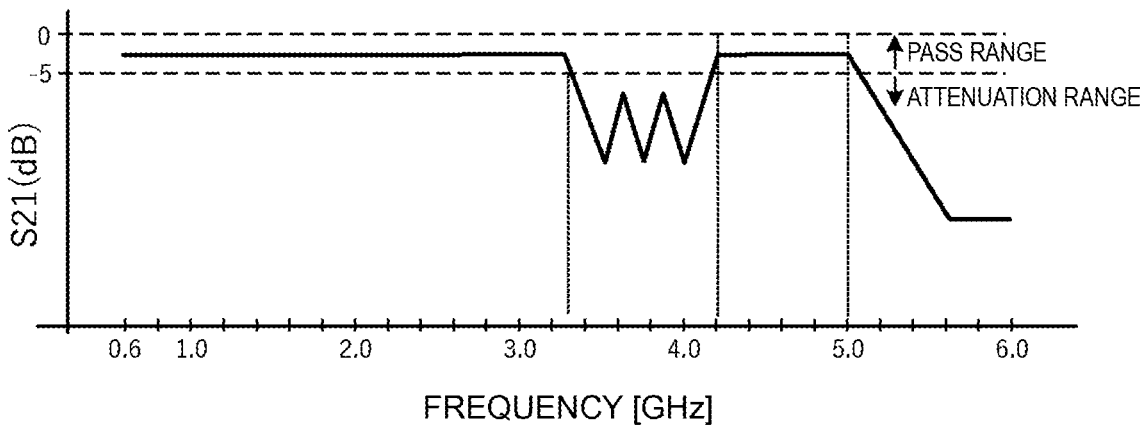
FIG. 19B is a frequency characteristic diagram of insertion loss of a second filter of the filter circuit of FIG. 17A.
Figure 19C:
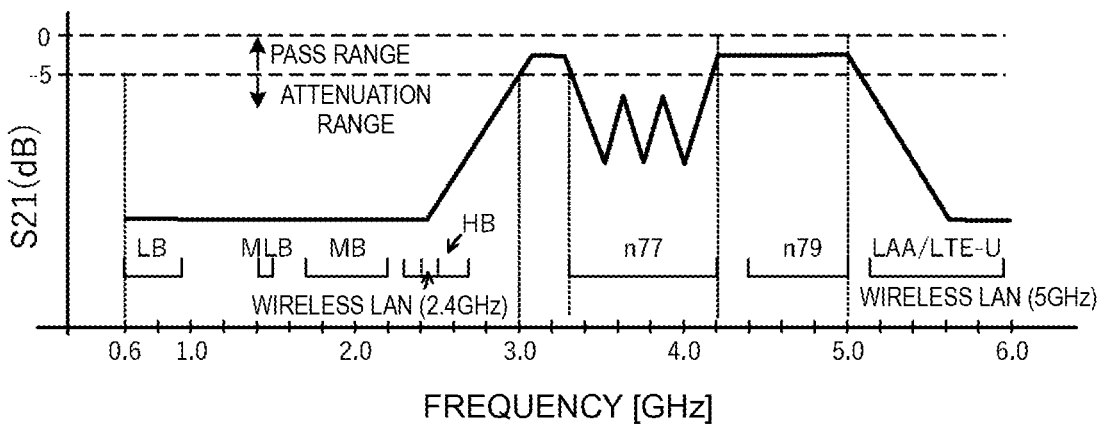
FIG. 19C is a frequency characteristic diagram of insertion loss of the filter circuit of FIG. 17A.

FIG. 19A is a frequency characteristic diagram of insertion loss of the first filter 1 of the filter circuit 106A, and FIG. 19B is a frequency characteristic diagram of insertion loss of the second filter 2 of the filter circuit 106A. Further, FIG. 19C is a frequency characteristic diagram of insertion loss of the filter circuit 106A.

In this way, the first filter 1 of the filter circuit 106A exhibits a band pass characteristic in which a frequency band between a cutoff frequency of about 3 GHz and about 5 GHz inclusive is a pass range and the other is a cutoff range. The second filter 2 has a low pass filter characteristic with a cutoff frequency of about 5 GHz and a notch filter characteristic that attenuates a frequency band between about 3.3 GHz and about 4.2 GHz inclusive.

Figure 20A:
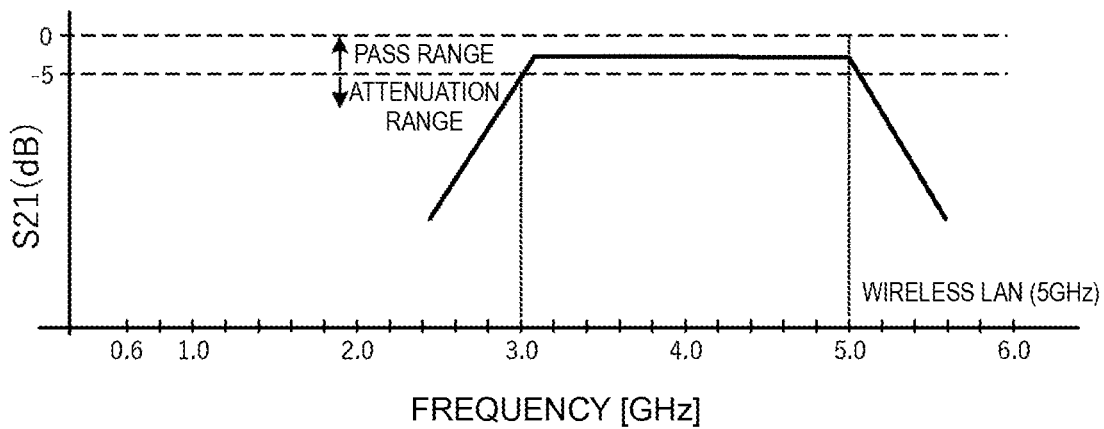
FIG. 20A is a frequency characteristic diagram of insertion loss of a first filter of the filter circuit of FIG. 17B.
Figure 20B:
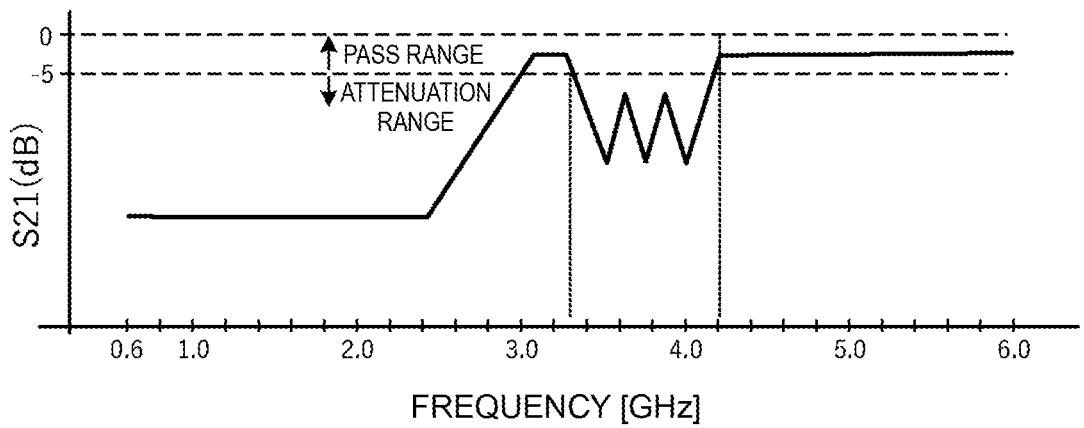
FIG. 20B is a frequency characteristic diagram of insertion loss of a second filter of the filter circuit of FIG. 17B.

FIG. 20A is a frequency characteristic diagram of insertion loss of the first filter 1 of the filter circuit 106B, and FIG. 20B is a frequency characteristic diagram of insertion loss of the second filter 2 of the filter circuit 106B. Further, FIG. 20C is a frequency characteristic diagram of insertion loss of the filter circuit 106B.

In this way, the first filter 1 of the filter circuit 106B exhibits a band pass characteristic in which a frequency band between a cutoff frequency of about 3 GHz and about 5 GHz inclusive is a pass range and the other is a cutoff range. The second filter 2 has a high pass filter characteristic with a cutoff frequency of about 3 GHz and a notch filter characteristic that attenuates a frequency band between about 3.3 GHz and about 4.2 GHz inclusive.

Figure 20C:
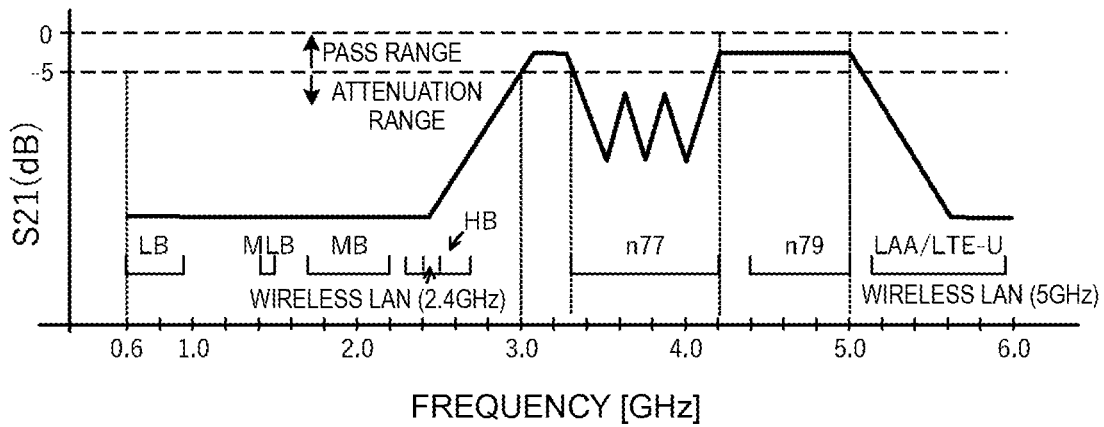
FIG. 20C is a frequency characteristic diagram of insertion loss of the filter circuit of FIG. 17B.

As illustrated in FIG. 19C and FIG. 20C, the filter circuits 106A and 106B, each has a band pass filter characteristic that allows a frequency band between about 3 GHz and about 5.0 GHz inclusive to pass and a notch filter characteristic that attenuates a frequency band between about 3.3 GHz and about 4.2 GHz inclusive. These filter circuits 106A and 106B have the same characteristics as that of the filter circuit 105 illustrated in the fifth embodiment.

The characteristics illustrated in FIG. 19C and FIG. 20C obtained by the configurations illustrated in FIG. 18A and FIG. 18B are substantially equal. However, in the second filter 2 formed of the ladder circuit made up of the series-connected acoustic wave resonators X1, X2, and X3 and the shunt-connected inductors L21, L22, and L23 illustrated in FIG. 18B, the insertion loss in a frequency band adjacent to the attenuation range (notch range) is greater whereas the insertion loss in a higher frequency side of Band n79, which is separated from the attenuation range (notch range), is smaller, and the attenuation in the frequencies not higher than about 3 GHz is greater.

Seventh Embodiment

Figure 21:
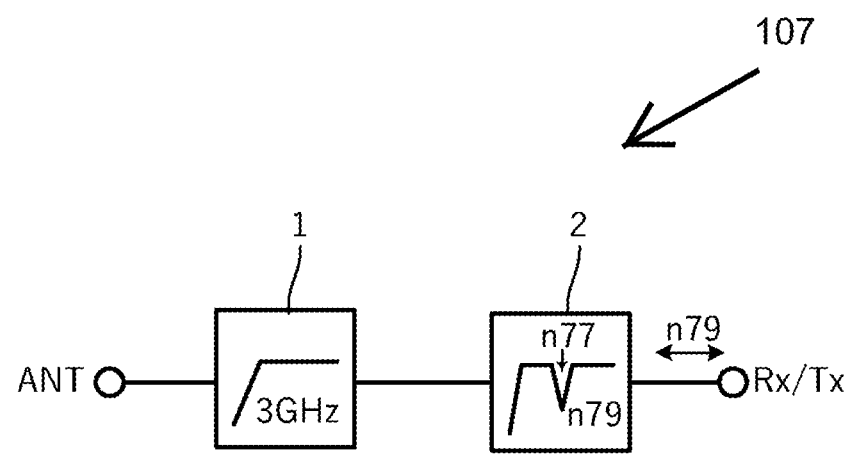
FIG. 21 is a block diagram of a filter circuit according to a seventh embodiment.

FIG. 21 is a block diagram of a filter circuit 107 according to the seventh embodiment. This filter circuit 107 includes an antenna terminal ANT to which an antenna is connected, a transmitting/receiving terminal Rx/Tx to which a transmitting/receiving circuit is connected, a first filter 1, and a second filter 2. The first filter 1 is a high pass filter with a cutoff frequency of about 3 GHz. The second filter 2 is a filter that attenuates Band n77 of the 3GPP band standards.

Figure 22:
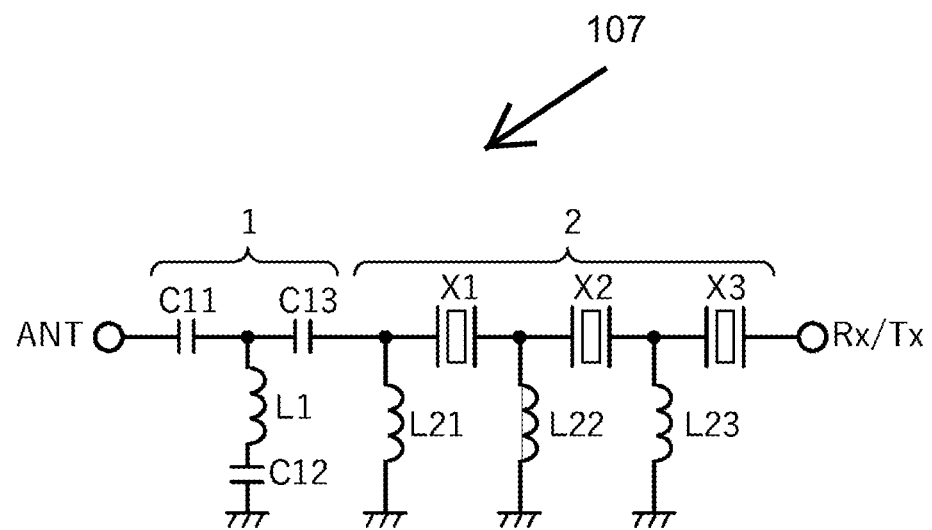
FIG. 22 is a diagram illustrating a circuit configuration of the filter circuit according to the seventh embodiment.

FIG. 22 is a diagram illustrating the circuit configuration of the filter circuit 107. The first filter 1 is made up of a shunt-connected series circuit of an inductor L1 and a capacitor C12 and series-connected capacitors C11 and C13.

The second filter 2 is a ladder circuit made up of series-connected acoustic wave resonators X1, X2, and X3 and shunt-connected inductors L21, L22, and L23.

Figure 23A:
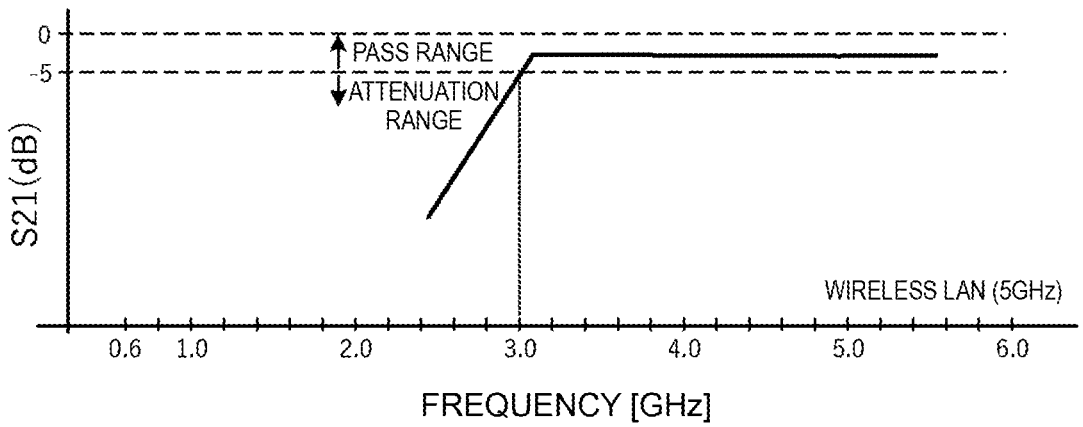
FIG. 23A is a frequency characteristic diagram of insertion loss of a first filter of the filter circuit according to the seventh embodiment.
Figure 23B:
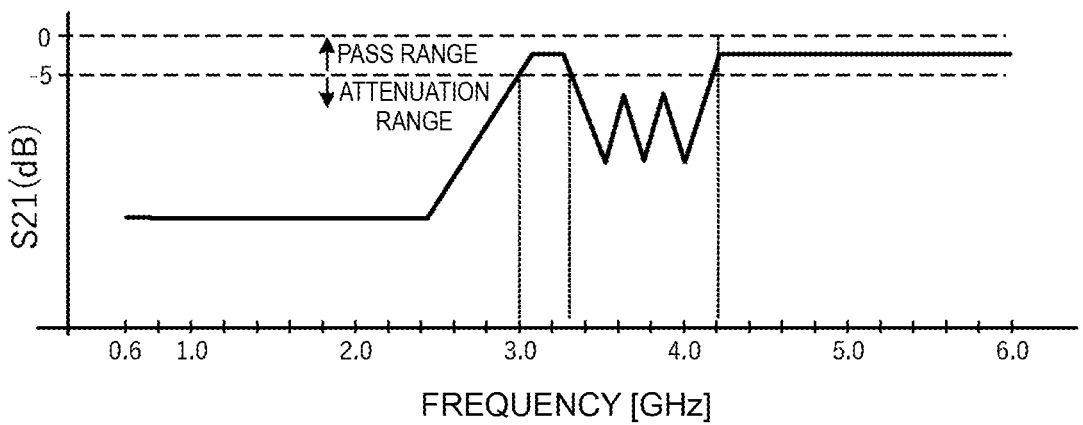
FIG. 23B is a frequency characteristic diagram of insertion loss of a second filter of the filter circuit according to the seventh embodiment.
Figure 23C:
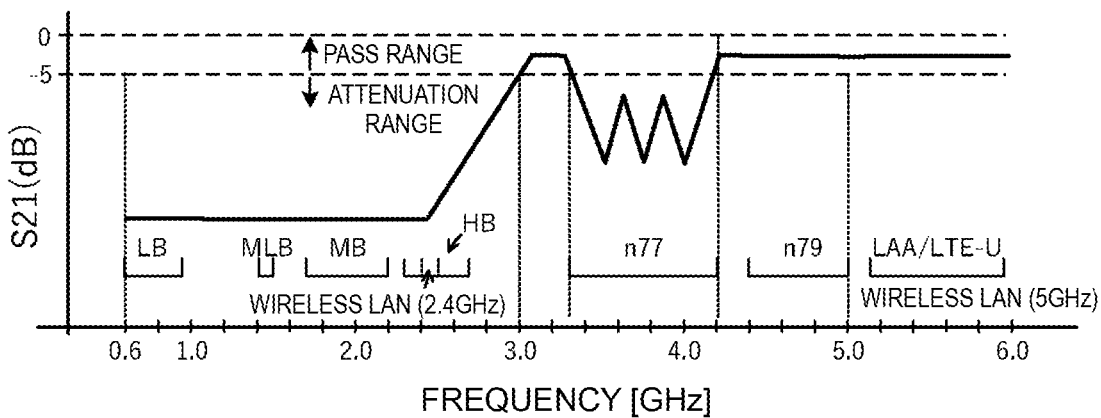
FIG. 23C is a frequency characteristic diagram of insertion loss of the filter circuit according to the seventh embodiment.

FIG. 23A is a frequency characteristic diagram of insertion loss of the first filter 1, and FIG. 23B is a frequency characteristic diagram of insertion loss of the second filter 2. Further, FIG. 23C is a frequency characteristic diagram of insertion loss of the filter circuit 107.

The first filter 1 exhibits a high pass characteristic with a cutoff frequency of about 3 GHz. The second filter 2 has a high pass filter characteristic with a cutoff frequency of about 3 GHz and a notch filter characteristic that attenuates a frequency band between about 3.3 GHz and about 4.2 GHz inclusive. Accordingly, this filter circuit 107 allows Band n79 of the 3GPP band standards to pass and cuts off Band n77. Further, the filter circuit 107 cuts off signals of LB band, MLB band, MB band, HB band of LTE standards and 2.4 GHz band wireless LAN.

Eighth Embodiment

Figure 24:
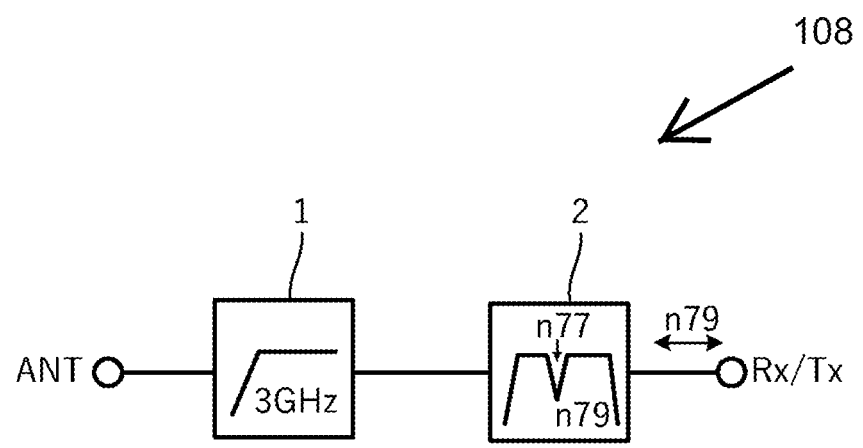
FIG. 24 is a block diagram of a filter circuit according to an eighth embodiment.

FIG. 24 is a block diagram of a filter circuit 108 according to the eighth embodiment. This filter circuit 108 includes an antenna terminal ANT to which an antenna is connected, a transmitting/receiving terminal Rx/Tx to which a transmitting/receiving circuit is connected, a first filter 1, and a second filter 2. The first filter 1 is a high pass filter with a cutoff frequency of about 3 GHz. The second filter 2 is a filter that attenuates Band n77 of the 3GPP band standards.

Figure 25:
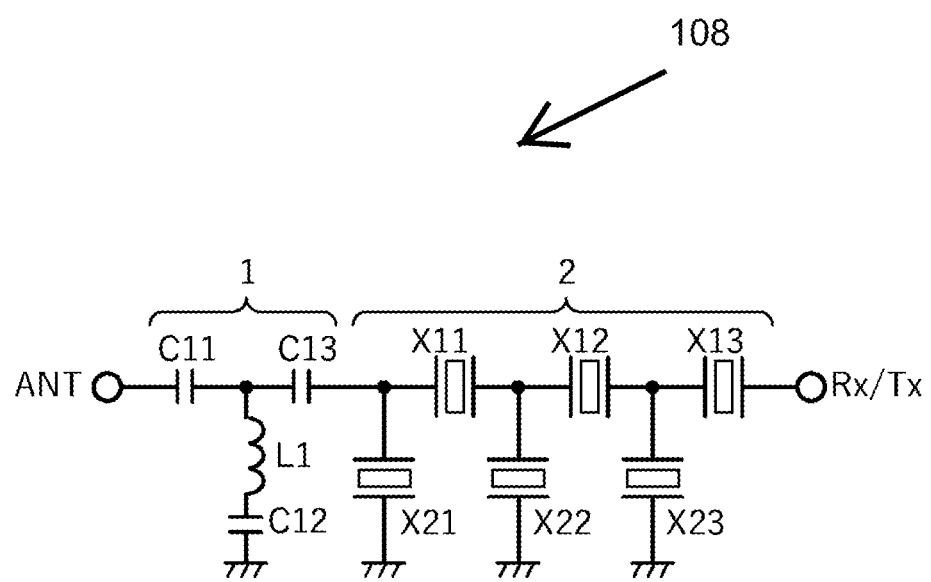
FIG. 25 is a diagram illustrating a circuit configuration of the filter circuit according to the eighth embodiment.

FIG. 25 is a diagram illustrating the circuit configuration of the filter circuit 108. The first filter 1 is made up of a shunt-connected series circuit of an inductor L1 and a capacitor C12 and series-connected capacitors C11 and C13.

The second filter 2 is made up of series-connected acoustic wave resonators X11, X12, and X13 and shunt-connected acoustic wave resonators X21, X22, and X23.

Figure 26A:
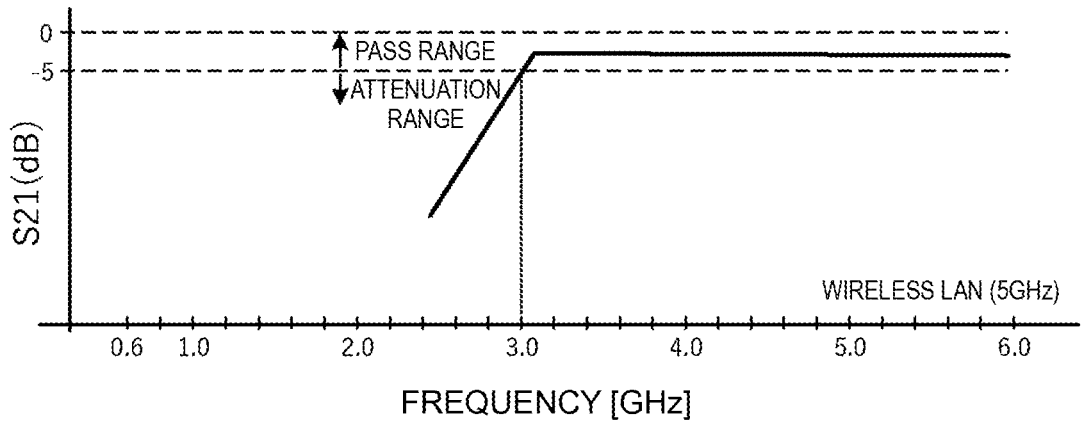
FIG. 26A is a frequency characteristic diagram of insertion loss of a first filter of the filter circuit according to the eighth embodiment.
Figure 26B:
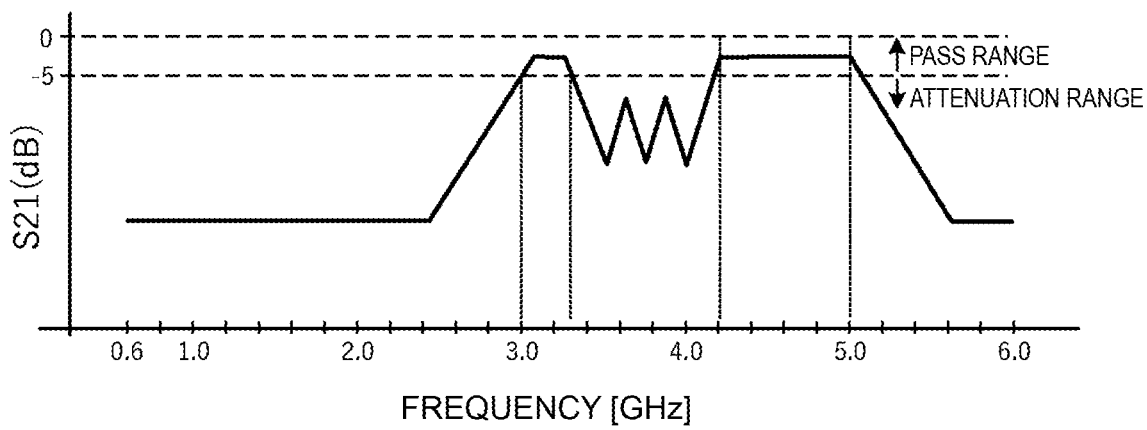
FIG. 26B is a frequency characteristic diagram of insertion loss of a second filter of the filter circuit according to the eighth embodiment.
Figure 26C:
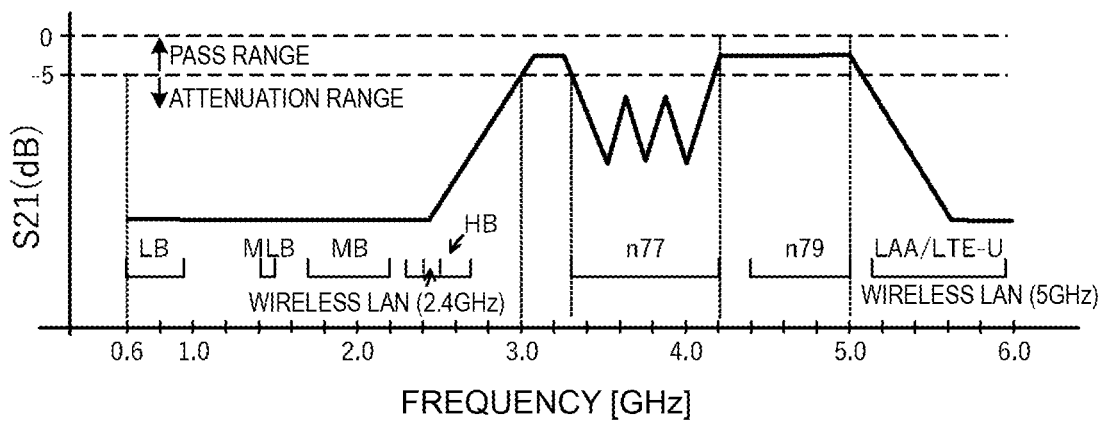
FIG. 26C is a frequency characteristic diagram of insertion loss of the filter circuit according to the eighth embodiment.

FIG. 26A is a frequency characteristic diagram of insertion loss of the first filter 1, and FIG. 26B is a frequency characteristic diagram of insertion loss of the second filter 2. Further, FIG. 26C is a frequency characteristic diagram of insertion loss of the filter circuit 108.

The first filter 1 exhibits a high pass characteristic with a cutoff frequency of about 3 GHz. The second filter 2 has a band pass filter characteristic in which a pass band is between about 3 GHz and about 5 GHz and a frequency band other than the pass band is a cutoff band, and a notch filter characteristic that attenuates a frequency band between about 3.3 GHz and about 4.2 GHz inclusive.

Accordingly, this filter circuit 108 allows Band n79 of the 3GPP band standards to pass and cuts off Band n77. Further, the filter circuit 108 cuts off signals of LB band, MLB band, MB band, HB band of LTE standards and 2.4 GHz band wireless LAN. Further, signals of LAA/LTE-U in Industry Science Medical (ISM) and 5.0 GHz band wireless LAN are cut off.

Ninth Embodiment

Figure 27:
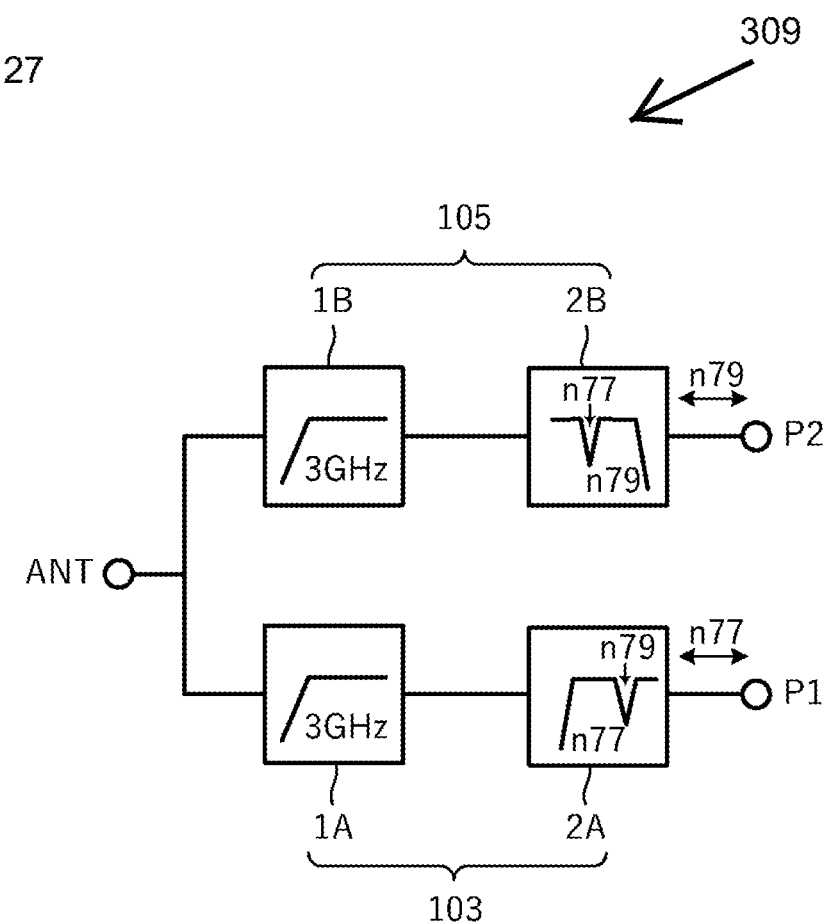
FIG. 27 is a block diagram of a filter device according to a ninth embodiment.
Figure 28:
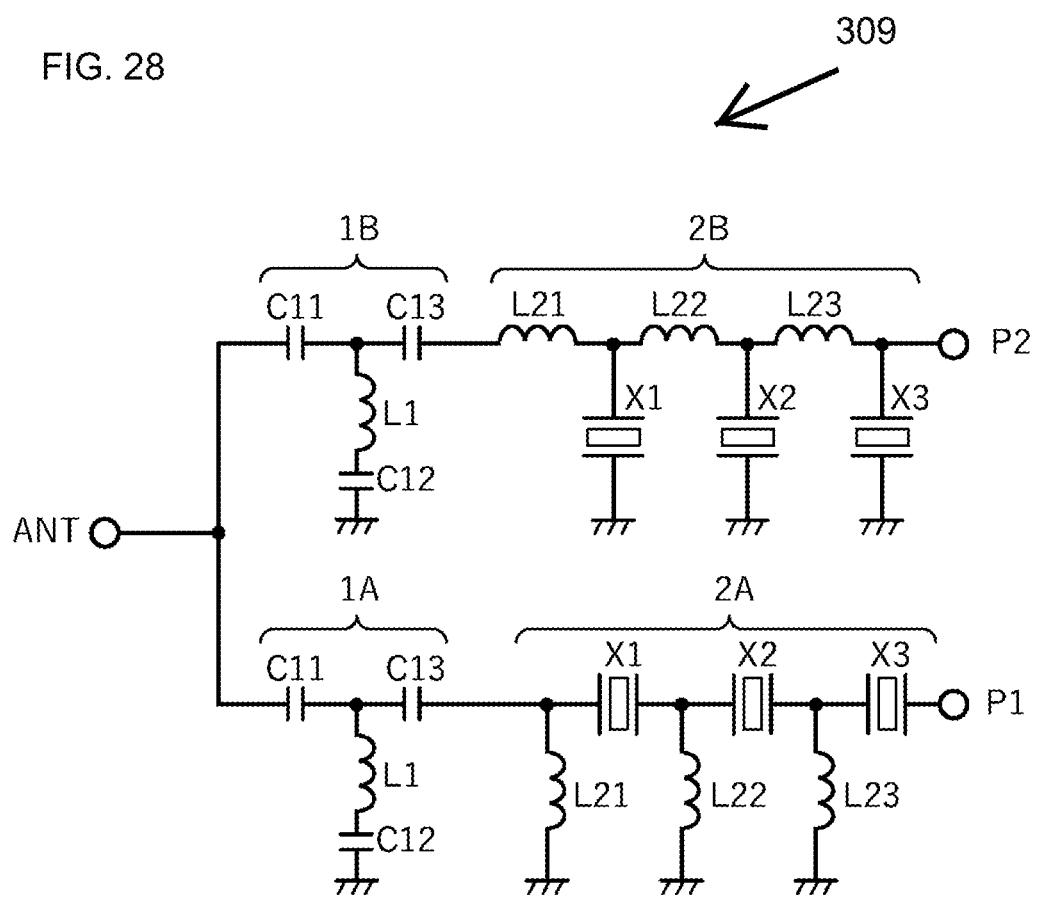
FIG. 28 is a circuit diagram of the filter device according to the ninth embodiment.

FIG. 27 is a block diagram of a filter device 309 according to the ninth embodiment. Further, FIG. 28 is a circuit diagram of the filter device 309.

This filter device 309 includes an antenna terminal ANT that is a common port, a first filter circuit 103, and a second filter circuit 105. The first filter circuit 103 and the second filter circuit 105 are provided between a first input/output port P1 and a second input/output port P2.

The first filter circuit 103 is the filter circuit 103 illustrated in the third embodiment. In other words, the first filter circuit 103 cuts off a frequency band not higher than about 3 GHz and cuts off Band n79. Further, the second filter circuit 105 is the filter circuit 105 illustrated in the fifth embodiment. In other words, the second filter circuit 105 cuts off a frequency band not higher than about 3 GHz and cuts off Band n77.

The filter device 309 of this embodiment can be used as a diplexer for Band n77 and Band n79 of the 3GPP band standards.

Tenth Embodiment

Figure 29:
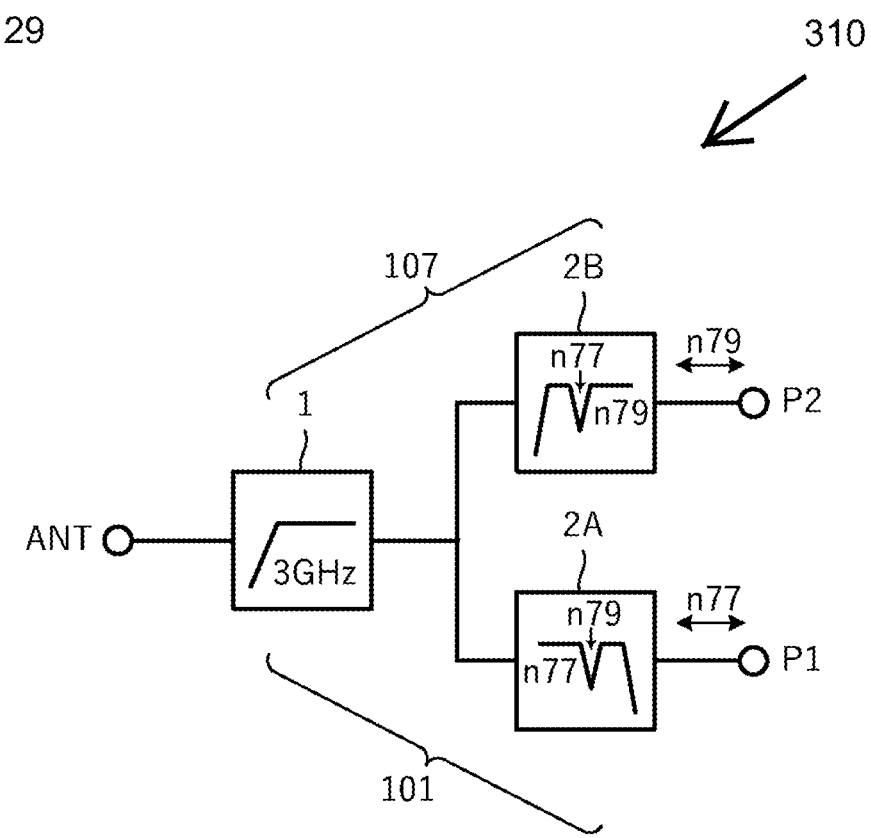
FIG. 29 is a block diagram of a filter device according to a tenth embodiment.
Figure 30:
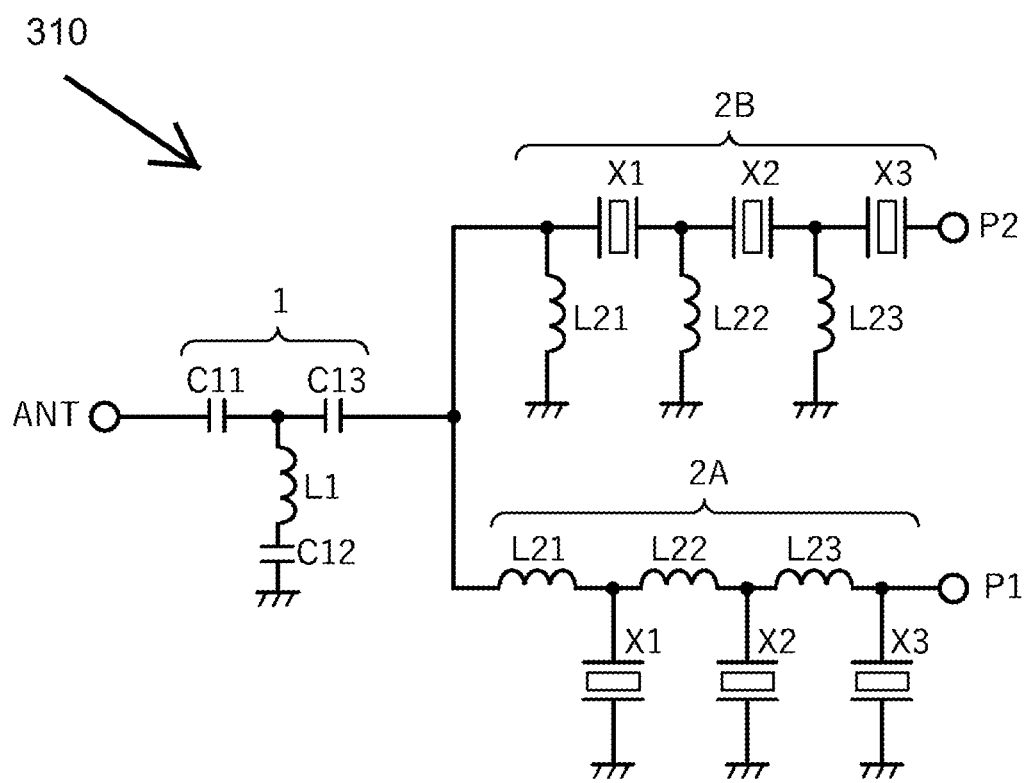
FIG. 30 is a circuit diagram of the filter device according to the tenth embodiment.

FIG. 29 is a block diagram of a filter device 310 according to the tenth embodiment. Further, FIG. 30 is a circuit diagram of the filter device 310.

This filter device 310 includes an antenna terminal ANT that is a common port, a first filter circuit 101, and a second filter circuit 107. The first filter circuit 101 and the second filter circuit 107 are provided between a first input/output port P1 and a second input/output port P2. The first filter circuit 101 is made up of a first filter 1 and a second filter 2A, and the second filter circuit 107 is made up of the first filter 1 and a second filter 2B. Note that the first filter 1 of the first filter circuit 101 and the first filter 1 of the second filter circuit 107 are a filter made up of a shared (common) LC circuit.

The configuration of the filter circuit 101 is the same as that of the filter circuit 101 illustrated in the first embodiment, and the configuration of the filter circuit 107 is the same as that of the filter circuit 107 illustrated in the seventh embodiment.

The filter device 310 of this embodiment can be used as a diplexer for Band n77 and Band n79 of the 3GPP band standards. The present embodiment enables to reduce the number of the first filters 1 and simplify the circuit.

Note that in the example illustrated in FIG. 29, the first filter 1 is made up of the high pass filter. Alternatively, the first filter 1 may be made up of the band pass filter illustrated in FIG. 4A or FIG. 4B, for example. Further, a combination of the first filter 1 and the second filter 2 (2A, 2B, and the like) is not limited to the one illustrated in FIG. 29, and any of the second filters 2 illustrated in the foregoing embodiments may be applied.

Eleventh Embodiment

Figure 31:
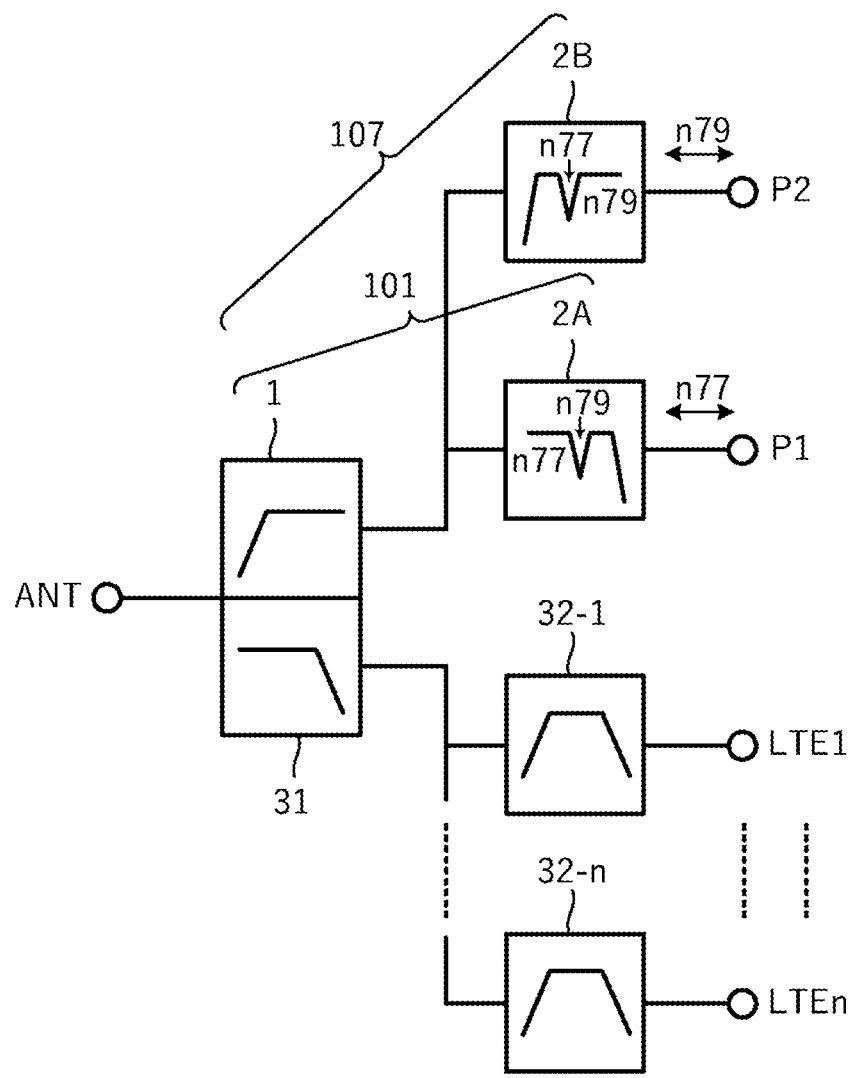
FIG. 31 is a block diagram of a filter device according to an eleventh embodiment.

FIG. 31 is a block diagram of a filter device 311 according to the eleventh embodiment. This filter device 311 includes filter circuits 101 and 107, a low pass filter 31 that allows a signal of a third frequency band which is not higher than about 3 GHz to pass and makes up a diplexer with a shared filter, and a plurality of band pass filters 32-1, ..., 32-n, each being connected to the low pass filter 31 and allowing a signal of the third frequency band to pass. The foregoing third frequency band is, for example, a frequency band of LTE or 2.4 GHz wireless LAN. LTE1, ..., LTEn of FIG. 31, each denotes an input/output port of a signal path for each frequency band. The first filter circuit 101 is made up of a first filter 1 and a second filter 2A, and the second filter circuit 107 is made up of the first filter 1 and a second filter 2B. Note that the first filter 1 of the first filter circuit 101 and the first filter 1 of the second filter circuit 107 are a filter made up of a shared (common) LC circuit.

The filter circuit 101 is the filter circuit 101 illustrated in the first embodiment. In other words, the filter circuit 101 cuts off a frequency band not higher than about 3 GHz and cuts off Band n79. Further, the filter circuit 107 is the filter circuit 107 illustrated in the seventh embodiment. In other words, the filter circuit 107 cuts off a frequency band not higher than about 3 GHz and cuts off Band n77.

The first filter 1 shared by the foregoing filter circuit 101 and the foregoing filter circuit 107 is a high pass filter with a cutoff frequency of about 3 GHz, and this first filter 1 and the low pass filter 31 make up a diplexer.

As described above, the filter circuits 101 and 107 cut off the frequency band not higher than about 3 GHz, and this enables the filter circuits 101 and 107 to be directly connected to a filter for a communication signal of not higher than about 3 GHz.

Twelfth Embodiment

In the twelfth embodiment, an exemplary filter circuit that handles frequency bands of Band n79 of 3GPP band and 5 GHz band wireless LAN.

Figure 32:
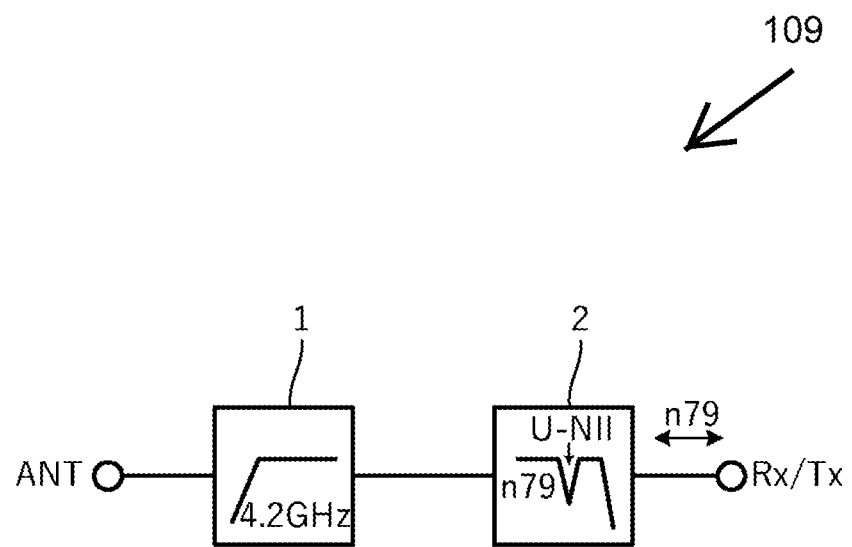
FIG. 32 is a block diagram of a filter circuit according to a twelfth embodiment.

FIG. 32 is a block diagram of a filter circuit 109 according to the twelfth embodiment. This filter circuit 109 includes an antenna terminal ANT to which an antenna is connected, a transmitting/receiving terminal Rx/Tx to which a transmitting/receiving circuit is connected, a first filter 1, and a second filter 2. The first filter 1 is a high pass filter in which a first frequency band is a pass band and a frequency band not higher than the first frequency band is an attenuation band. The second filter 2 is a filter that attenuates a third frequency band within the first frequency band.

In the present embodiment, the first frequency band is a frequency band not lower than about 4.2 GHz (a frequency band of about 4.2 GHz and above). The second frequency band is Band n79 of the 3GPP bands. Further, the third frequency band is a frequency band between about 5.15 GHz and about 7.125 GHz inclusive in the Unlicensed National Information Infrastructure (U-NII) band to be used in the 5 GHz band of wireless LAN. In other words, the second filter 2 cuts off the U-NII band and allows Band n79 to pass.

The first filter 1 is a filter formed of an LC circuit, and the second filter 2 is a filter that uses an attenuation pole produced by a resonance or an antiresonance of an acoustic wave resonator for attenuation. Further, the first filter 1 is placed closer to the antenna terminal ANT than the second filter 2.

The configuration of the first filter 1 and the basic configuration of the second filter 2 are, for example, similar to those of the circuit illustrated in FIG. 2 in the first embodiment.

Figure 33A:
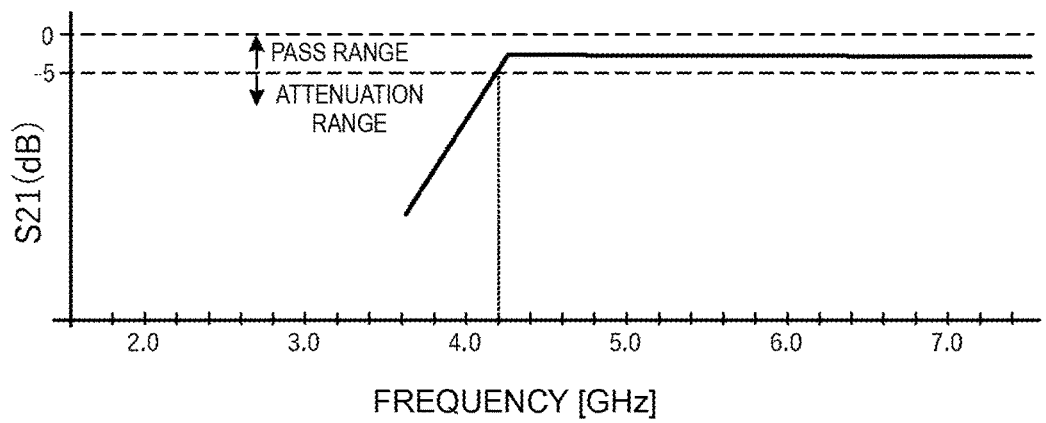
FIG. 33A is a frequency characteristic diagram of insertion loss of a first filter of the filter circuit according to the twelfth embodiment.
Figure 33B:
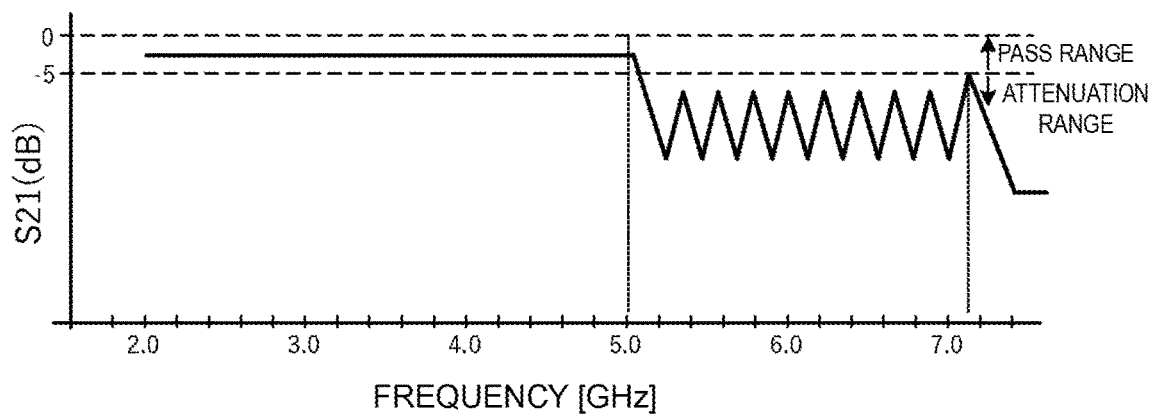
FIG. 33B is a frequency characteristic diagram of insertion loss of a second filter of the filter circuit according to the twelfth embodiment.
Figure 33C:
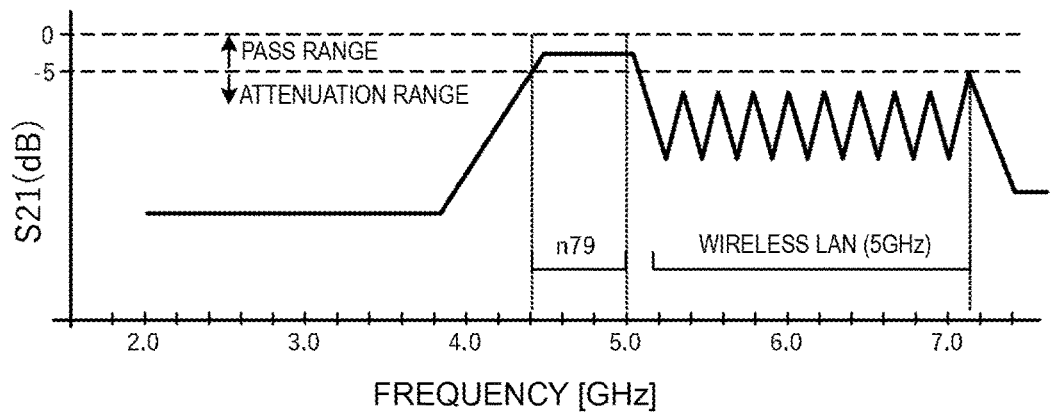
FIG. 33C is a frequency characteristic diagram of insertion loss of the filter circuit according to the twelfth embodiment.

FIG. 33A is a frequency characteristic diagram of insertion loss of the first filter 1, and FIG. 33B is a frequency characteristic diagram of insertion loss of the second filter 2. Further, FIG. 33C is a frequency characteristic diagram of insertion loss of the filter circuit 109. In all the drawings, the horizontal axis represents the frequency, and the vertical axis represents S21 (transmission coefficient) of S-parameters. Here, the threshold value between the pass range and the cutoff range is about −5 dB.

The first filter 1 exhibits a high pass characteristic with a cutoff frequency of about 4.2 GHz. The second filter 2 has a low pass filter characteristic with a cutoff frequency of about 7.125 GHz and a notch filter characteristic that attenuates a frequency band between about 5.15 GHz and about 7.125 GHz inclusive.

As illustrated in FIG. 33C, the filter circuit 109 has a band pass filter characteristic that allows a frequency band between about 4.4 GHz and about 5.0 GHz inclusive to pass and a notch filter characteristic that attenuates a frequency band between about 5.15 GHz and about 7.125 GHz inclusive. Accordingly, this filter circuit 109 allows Band n79 of the 3GPP band standards to pass and cuts off the U-NII band.

As illustrated in the present embodiment, the present disclosure can be applied to a filter circuit that allows Band n79 that is the second frequency band to pass and that cuts off the U-NII band that is the third frequency band.

Lastly, the foregoing descriptions of the embodiments are exemplary in all aspects and are not restrictive. For a person skilled in the art, modifications and variations can be performed as needed. The scope of the present disclosure is defined by the scope of claims and not by the foregoing embodiments. Furthermore, variations from the embodiments which come within the scope of the claims and the range of equivalence are included in the scope of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A filter circuit configured to be connected to an antenna terminal, the filter circuit comprising:
   a first filter including an LC circuit in which a first frequency band is a pass band and a frequency band not higher than the first frequency band is an attenuation band, the first filter comprising a shunt-connected series circuit including an inductor and a capacitor; and a second filter that attenuates at least part of one of a second frequency band and a third frequency band using an attenuation pole produced by a resonance or an antiresonance of an acoustic wave resonator, the second frequency band and the third frequency band being included in the first frequency band, the third frequency band being higher in frequency than the second frequency band, the first filter is arranged closer to the antenna terminal than the second filter, an attenuation of the first filter is greater than −10 dB at a frequency band not higher than the first frequency band, wherein the second filter is a ladder circuit including a plurality of stages of series-connected acoustic wave resonators and shunt-connected inductors.

2. A filter device comprising:

a first filter circuit and a second filter circuit provided between a common port and a first input/output port and between the common port and a second input/output port, respectively, wherein the first filter circuit and the second filter circuit are each a filter circuit as per the filter circuit according to claim 1, and the first filter circuit attenuates Band n77 that is the second frequency band, and the second filter circuit attenuates Band n79 that is the third frequency band.

3. The filter device according to claim 2, wherein the first filter of the first filter circuit is the same filter as the first filter of the second filter circuit.

4. A filter device comprising:

the filter device according to claim 3;

a low pass filter that makes up a diplexer with the first filter, the low pass filter allowing a signal of a fourth frequency band not higher than 3 GHz to pass; and a band pass filter that allows a signal of the fourth frequency band to pass, the band pass filter being connected to the low pass filter.

5. The filter circuit according to claim 1, wherein the first filter is a high pass filter.

6. The filter circuit according to claim 5, wherein the first frequency band is a frequency band not lower than 3 GHz.

7. The filter circuit according to claim 5, wherein the second frequency band is a frequency band between 3.3 GHz and 4.2 GHz inclusive.

8. The filter circuit according to claim 5, wherein the third frequency band is a frequency band between 4.4 GHz and 5.0 GHz inclusive.

9. The filter circuit according to claim 5, wherein the second frequency band is a frequency band between 4.4 GHz and 5.0 GHz inclusive, and the third frequency band is a frequency band between 5.15 GHz and 7.125 GHz inclusive.

10. A filter device comprising:

a first filter circuit and a second filter circuit provided between a common port and a first input/output port and between the common port and a second input/output port, respectively, wherein the first filter circuit and the second filter circuit are each a filter circuit as per the filter circuit according to claim 5, and the first filter circuit attenuates Band n77 that is the second frequency band, and the second filter circuit attenuates Band n79 that is the third frequency band.

11. The filter circuit according to claim 1, wherein the first frequency band is a frequency band not lower than 3 GHz.

12. The filter circuit according to claim 1, wherein the second frequency band is a frequency band between 3.3 GHz and 4.2 GHz inclusive.

13. The filter circuit according to claim 1, wherein the third frequency band is a frequency band between 4.4 GHz and 5.0 GHz inclusive.

14. The filter circuit according to claim 1, wherein the second frequency band is a frequency band between 4.4 GHz and 5.0 GHz inclusive, and the third frequency band is a frequency band between 5.15 GHz and 7.125 GHz inclusive.

15. The filter circuit according to claim 1, wherein the first filter is a band pass filter.

* * * * *